(12) United States Patent
Kumano

(10) Patent No.: US 9,136,163 B2
(45) Date of Patent: Sep. 15, 2015

(54) MANUFACTURING METHOD FOR SEMICONDUCTOR DEVICE AND SEMICONDUCTOR DEVICE

(71) Applicant: CANON KABUSHIKI KAISHA, Tokyo (JP)

(72) Inventor: Hideomi Kumano, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 213 days.

(21) Appl. No.: 13/904,535

(22) Filed: May 29, 2013

(65) Prior Publication Data

US 2013/0321680 A1    Dec. 5, 2013

(30) Foreign Application Priority Data

May 31, 2012    (JP) ................. 2012-124838

(51) Int. Cl.
| | |
|---|---|
| *H01L 21/4763* | (2006.01) |
| *H01L 29/40* | (2006.01) |
| *H01L 21/768* | (2006.01) |
| *H01L 31/18* | (2006.01) |
| *H01L 31/02* | (2006.01) |
| *H01L 23/48* | (2006.01) |
| *H01L 27/146* | (2006.01) |

(52) U.S. Cl.
CPC .... *H01L 21/76807* (2013.01); *H01L 21/76898* (2013.01); *H01L 23/481* (2013.01); *H01L 27/1464* (2013.01); *H01L 27/14634* (2013.01); *H01L 27/14636* (2013.01); *H01L 31/02002* (2013.01); *H01L 31/18* (2013.01); *H01L 2224/48463* (2013.01); *H01L 2924/13091* (2013.01)

(58) Field of Classification Search
CPC ................................... H01L 21/76807
USPC ............... 257/774, 760; 438/637, 666, 597
See application file for complete search history.

(56) References Cited

U.S. PATENT DOCUMENTS

| | | | | |
|---|---|---|---|---|
| 8,541,878 | B2 * | 9/2013 | Takahashi et al. | ............ 257/760 |
| 8,848,075 | B2 * | 9/2014 | Takahashi et al. | ............ 348/294 |
| 2010/0238331 | A1 | 9/2010 | Umebayashi | |
| 2011/0102657 | A1 | 5/2011 | Takahashi | |
| 2011/0233702 | A1 | 9/2011 | Takahashi | |

FOREIGN PATENT DOCUMENTS

| | | |
|---|---|---|
| JP | 2010-245506 A | 10/2010 |
| JP | 2011-204915 A | 10/2011 |

* cited by examiner

*Primary Examiner* — Calvin Lee
(74) *Attorney, Agent, or Firm* — Canon U.S.A., Inc. IP Division

(57) ABSTRACT

A step of forming a connecting member configured to electrically connect a first conductive line and a second conductive line includes a phase of perforating a laminate from a first semiconductor wafer to form a plurality of connection holes that reach the second conductive line and a phase of filling the plurality of penetrating connection holes with a conductive material to form conductive sections in contact with the second conductive line.

17 Claims, 15 Drawing Sheets

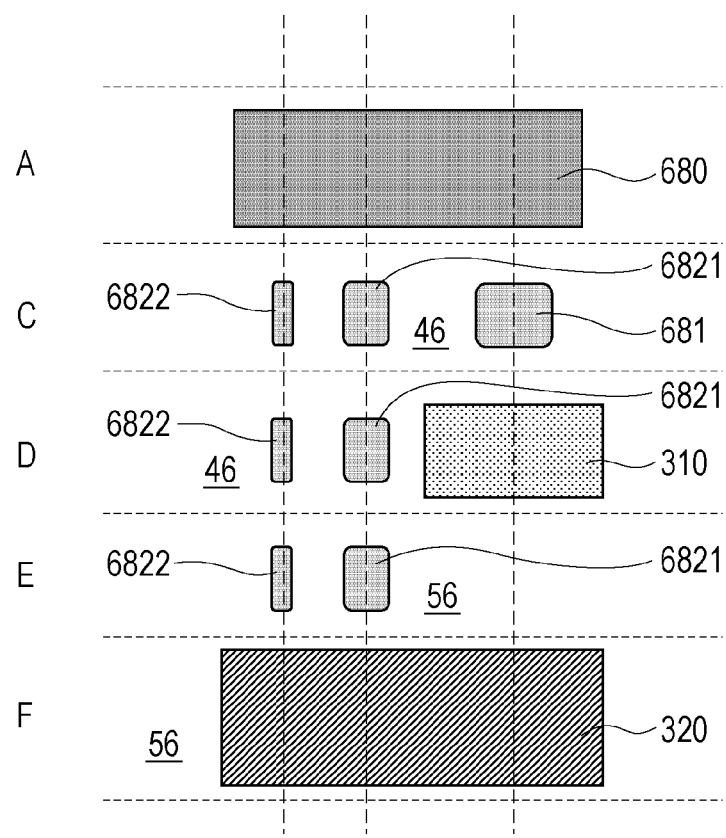

MANUFACTURING METHOD FOR SEMICONDUCTOR DEVICE AND SEMICONDUCTOR DEVICE

BACKGROUND

1. Technical Field

Aspects of the present invention relate to a manufacturing method for a semiconductor device using a plurality of semiconductor substrates.

2. Description of the Related Art

Forming semiconductor devices by laminating semiconductor wafers has been studied for the purposes of reducing footprints and the like. For such semiconductor devices, there is a demand to provide electrical continuity between semiconductor wafers. A technique of bonding semiconductor wafers and then electrically connecting circuits provided on the semiconductor wafers is disclosed in US2011/0102657. Specifically, a connection hole is formed in each semiconductor wafer and the connection holes are filled with a conductive material to provide the electrical continuity.

FIG. 8 is a diagram of exemplified defects that can be caused in a semiconductor device when the manufacturing method described in US2011/0102657 is used. With reference to FIG. 8, a first semiconductor substrate 10 and a second semiconductor substrate 20 have been bonded and laminated with a first wiring structure 31 and a second wiring structure 32 interposed therebetween. The first wiring structure 31 includes a first conductive line 311, and the second wiring structure 32 includes a second conductive line 322. In order to connect the first conductive line 311 and the second conductive line 322 electrically, this laminate has been perforated to form holes 65 and 66 which are then filled with a conductive material 68.

As illustrated in FIG. 8, one hole is provided for each conductive line, namely the hole 65 extending toward the second conductive line 322 and the hole 66 extending toward the first conductive line 311. Hence, a foreign substance 531, as illustrated in FIG. 8, would prevent a connection hole from being formed to reach the second conductive line 322, posing a risk of connection failure between the substrates due to defective perforation. Furthermore, even if a hole is formed successfully to reach the first conductive line 311, a foreign substance 532 may prevent a conductive material from being filled in the hole successfully to reach the first conductive line 311, posing a risk of the connection failure between the substrates due to defective filling of the conductive material. As a matter of course, the defective filling may occur in the hole 65, and the defective perforation may happen to the hole 66. As described above, the related art suffers from a low degree of reliability of the electrical continuity between the first conductive line 311 and the second conductive line 322.

SUMMARY

A first aspect of the present disclosure includes: preparing a laminate of a first component and a second component, the first component including a first semiconductor substrate and a first conductive line supported by the first semiconductor substrate, the second component including a second semiconductor substrate and a second conductive line supported by the second semiconductor substrate; and forming a connecting member configured to electrically connect the first conductive line and the second conductive line of the laminate, wherein the forming of the connecting member includes: a phase of perforating the laminate from a side of the first component to form a plurality of connection holes that reach the second conductive line; and a phase of filling the plurality of connection holes with a conductive material to form conductive sections in contact with the second conductive line.

A second aspect of the present disclosure includes: preparing a laminate of a first component and a second component, the first component including a first semiconductor substrate and a first conductive line supported by the first semiconductor substrate, the second component including a second semiconductor substrate and a second conductive line supported by the second semiconductor substrate; and forming a connecting member configured to electrically connect the first conductive line and the second conductive line of the laminate, wherein the forming of the connecting member includes: a phase of perforating the laminate from a side of the first component to form a plurality of connection holes that reach the first conductive line; and a phase of filling the plurality of connection holes with a conductive material to form conductive sections in contact with the first conductive line.

A third aspect of the present disclosure includes a first semiconductor substrate; a first semiconductor element provided on the first semiconductor substrate; a first wiring section connected to the first semiconductor element; a second semiconductor substrate; a second semiconductor element provided on the second semiconductor substrate; a second wiring section connected to the second semiconductor element; and a connecting member configured to electrically connect the first wiring section and the second wiring section, wherein the connecting member includes at least one of a plurality of conductive sections provided through the first semiconductor substrate and in contact with the first wiring section and a plurality of conductive sections provided through the first semiconductor substrate and in contact with the second wiring section.

Further features of the present invention will become apparent from the following description of exemplary embodiments (with reference to the attached drawings).

BRIEF DESCRIPTION OF THE DRAWINGS

FIGS. 5A and 5B are schematic views of an exemplary semiconductor device;

DESCRIPTION OF THE EMBODIMENTS

Some embodiments will be described herein concerning a semiconductor device, in which a connecting member is formed for a laminate that includes a first component, including a first conductive line, and a second component, including a second conductive line, the connecting member being formed for electrically connecting the first conductive line and the second conductive line. In such embodiments, the connecting member is provided with redundancy so that reliability can be improved for electrical continuity between the first conductive line and the second conductive line.

Figure 1A:
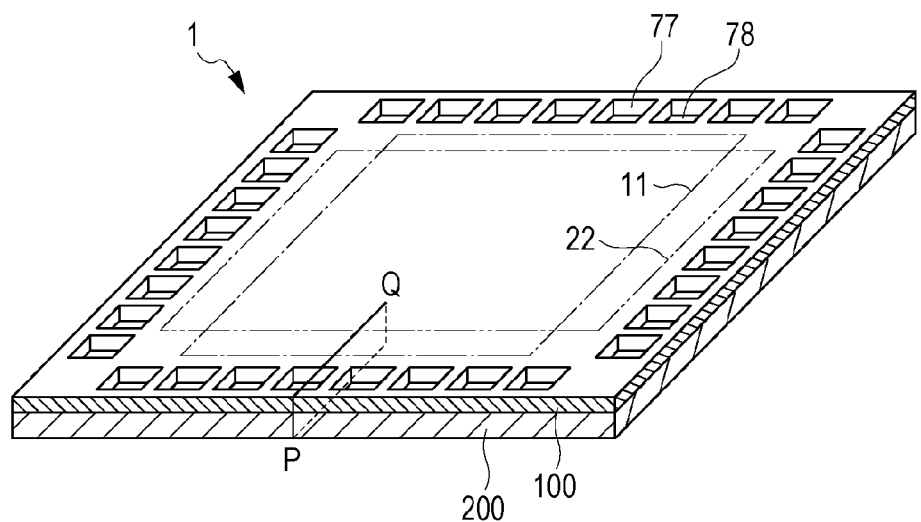
FIGS. 1A to 1C are schematic views of exemplary semiconductor devices.

FIG. 1A is a schematic view of an exemplary semiconductor device 1. The semiconductor device 1 of this example constitutes an image sensing device (a solid-state image sensing device), but it may constitute a storage device, an arithmetic unit, or a display device. The semiconductor device 1 includes a first member 100 and a second member 200. The first member 100 includes an image sensing region 11 that includes an array of photoelectric conversion elements. The second member 200 includes a signal processing region 22 that processes a signal obtained by the image sensing region 11. The first member 100 has an opening 77 to expose an electrode pad 78.

Figure 1B:
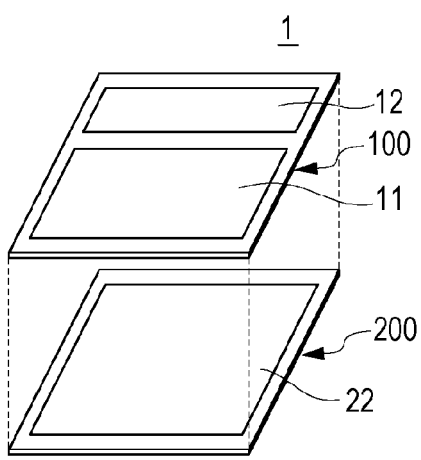
Figure 1C:
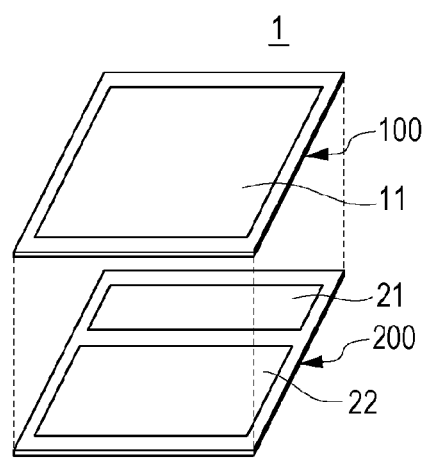

FIGS. 1B and 1C are schematic views of other examples of the semiconductor device 1 illustrated in FIG. 1A. In an example illustrated in FIG. 1B, a first member 100 includes a control region 12 in addition to the image sensing region 11. In an example illustrated in FIG. 1C, a second member 200 includes the control region 21 in addition to the signal processing region 22. In this manner, a control region may be included in the first member 100 and/or in the second member 200. The control region 12 and the control region 21 each refer to a region provided with a circuit to control at least one of the image sensing region 11 and the signal processing region 22.

The first member 100 includes a first semiconductor substrate and a first wiring structure. The second member 200 includes a second semiconductor substrate and a second wiring structure. The image sensing region 11, the control region 12, the control region 21, and the signal processing region 22 each include an integrated circuit that includes a group of semiconductor elements, such as a transistor and a diode, on a semiconductor substrate. Circuits in these regions are connected so as to send and receive signals to/from circuits in any regions. The first member 100 includes a semiconductor element (a first semiconductor element), provided on the first semiconductor substrate, and a first wiring section connected to the first semiconductor element. The second member 200 includes a semiconductor element (a second semiconductor element), provided on the second semiconductor substrate, and a second wiring section connected to the second semiconductor element.

In the present embodiment, the first wiring section, connected to the first semiconductor element, and the second wiring section, connected to the second semiconductor element, are connected with each other by a connecting member. This enables the first semiconductor element and the second semiconductor element to be connected electrically through inter-substrate wiring, which is constituted by the first wiring section, the connecting member, and the second wiring section. Some embodiments of the electrical continuity will now be described in detail.

Figure 2A:
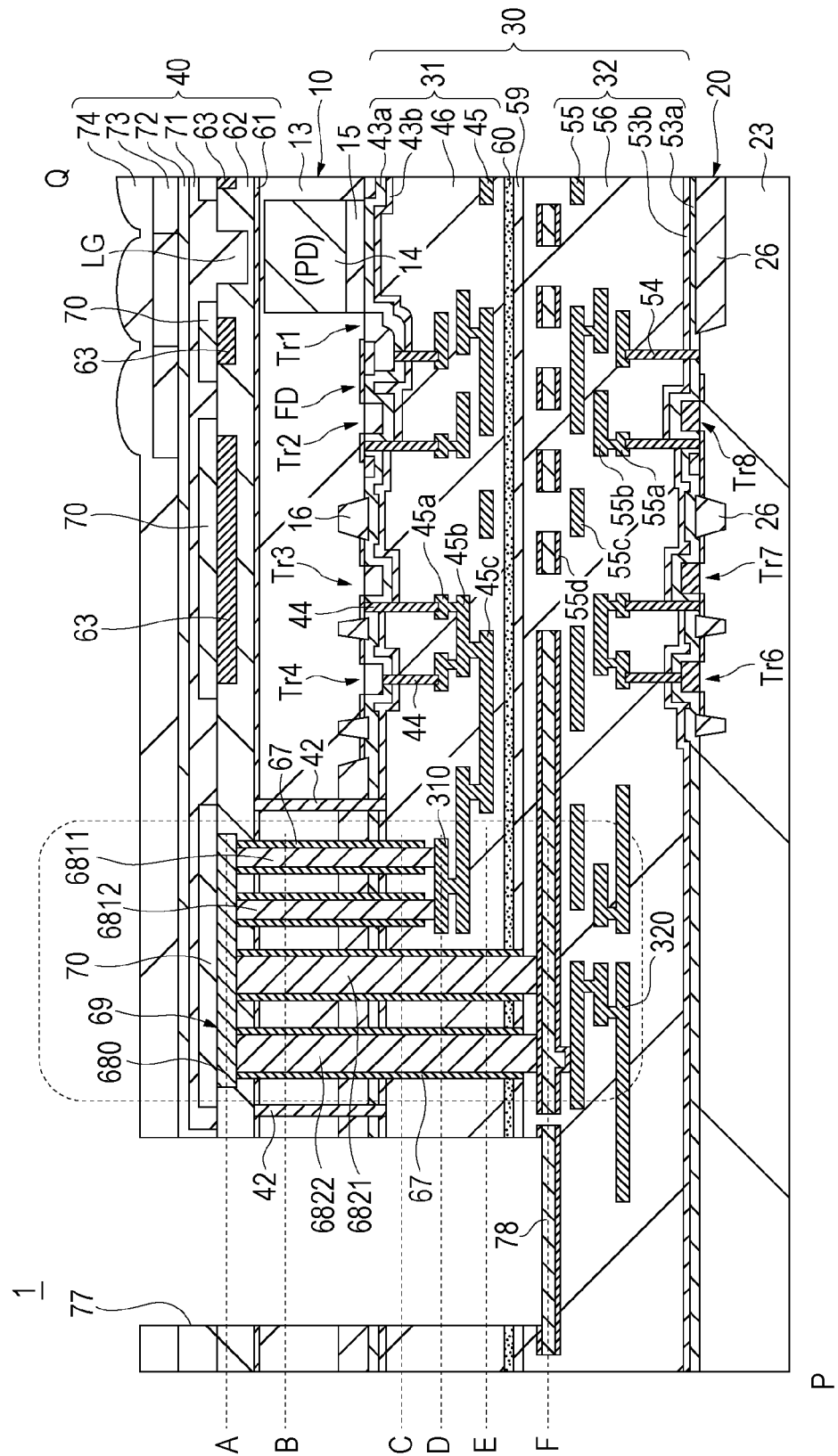
FIGS. 2A and 2B are schematic views of an exemplary semiconductor device.
Figure 2B:
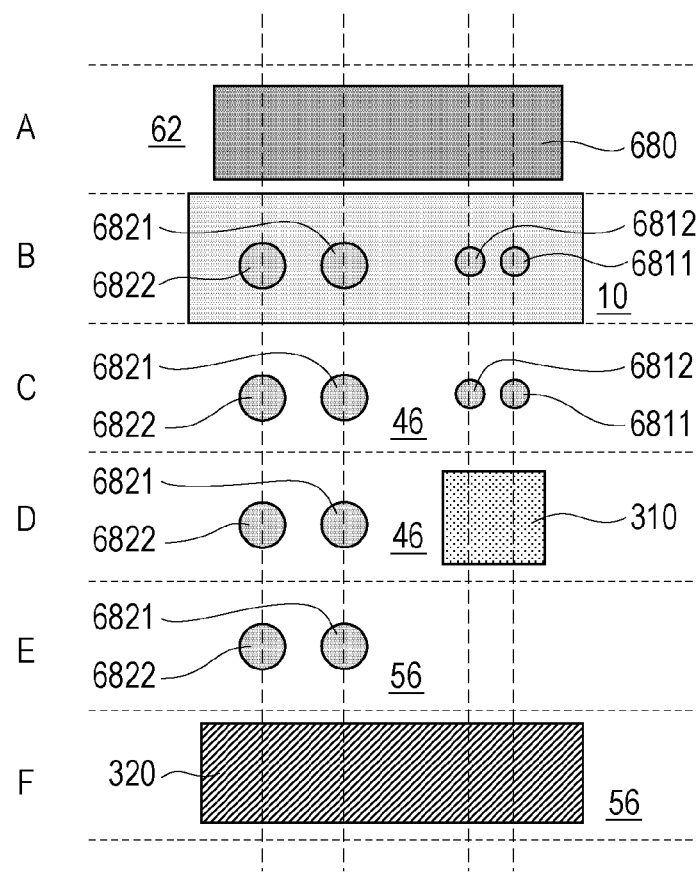

An example of a first embodiment will now be described with reference to FIGS. 2A and 2B. FIG. 2A is a cross-sectional view of a configuration as illustrated in FIG. 1B taken along a line P-Q of FIG. 1A. FIG. 2B is a diagram of plan views of part (including a connecting member 69) of FIG. 2A enclosed by a broken line at positions A, B, C, D, E, and F.

A first semiconductor substrate 10 includes a photodiode PD and transistors Tr1 and Tr2 as semiconductor elements constituting the image sensing region 11. In addition, the first semiconductor substrate 10 includes transistors Tr1 and Tr4 as semiconductor elements constituting the control region 12.

A first wiring structure 31 is provided on a surface of the first semiconductor substrate 10. The first wiring structure 31 includes a conductor section that includes a contact plug 44 and a group of metal layers 45. The group of metal layers 45 includes a first metal layer 45a, a second metal layer 45b, and a third metal layer 45c. In addition, the first wiring structure 31 includes an insulator section that includes a surface insulating film and an interlayer insulating film 46. The surface insulating film includes a first surface insulating layer 43a and a second surface insulating layer 43b. The conductor section is embedded in the insulator section. Part of the conductor section may be exposed from the insulator section. The conductor section of the first wiring structure 31 includes (many) conductive lines, each of which constitutes an electrical path. Here, that one conductive line refers to a continuous part of the conductor section. Conversely, the conductive lines of the conductor section are discontinuous from each other because of the insulator section in the wiring structure or a semiconductor section of the semiconductor substrate. From an electric circuit viewpoint, one conductive line is an electrically continuous part that constitutes one node. A description will be now provided with a focus on a first wiring section 310 that constitutes one conductive line (inter-substrate wiring) in the first wiring structure 31.

The first wiring section 310, illustrated in FIG. 2A, is electrically connected to the transistors Tr1 and Tr4. The first wiring section 310 includes the contact plug 44, the first metal layer 45a, the second metal layer 45b, and the third metal layer 45c.

A second semiconductor substrate 20 includes transistors Tr6, Tr7, and Tr8 as semiconductor elements constituting the signal processing region 22.

A second wiring structure 32 is provided on a surface of the second semiconductor substrate 20. The second wiring structure 32 includes a conductor section that includes a contact plug 54 and a group of metal layers 55. The group of metal layers 55 includes a first metal layer 55a, a second metal layer 55b, a third metal layer 55c, and a fourth metal layer 55d. In addition, the second wiring structure 32 includes an insulator section that includes a surface insulating film and an interlayer insulating film 56. The surface insulating film includes a first surface insulating layer 53a and a second surface insulating layer 53b. The conductor section is embedded in the insulator section. Part of the conductor section may be exposed from the insulator section. Similarly to the first wiring section 310, a description will be provided with a focus on a second wiring section 320 that constitutes one conductive line (inter-substrate wiring) in the second wiring structure 32.

The second wiring section 320, illustrated in FIG. 2A, is electrically connected to the transistors Tr6 and Tr7. The second wiring section 320 includes the contact plug 54, the first metal layer 55a, the second metal layer 55b, the third metal layer 55c and the fourth metal layer 55d. Note that it appears in FIG. 2A as if the second wiring section 320 is not connected to the transistors Tr6 and Tr7, but the metal layers are actually continuous at a location not shown in the figure.

In this example, a primary material of the contact plugs 44 and 54 is tungsten. A primary material of the first metal layer 45a, the second metal layer 45b, the third metal layer 45c, the first metal layer 55a, the second metal layer 55b, and third metal layer 55c is copper. A primary material of the fourth metal layer 55d is aluminum. Note that the materials are not limited to those described above.

The first wiring structure 31 and the second wiring structure 32 are joined mechanically to form the wiring structure 30. In this example, the joining of the first wiring structure 31 and the second wiring structure 32 is achieved with an attaching layer 60. The first wiring section 310 of the first wiring structure 31 and the second wiring section 320 of the second wiring structure 32 are connected electrically with each other by the connecting member 69 that is a conductor. The first wiring section 310, the second wiring section 320, and the connecting member 69 constitute the inter-substrate wiring. The connecting member 69 includes a first penetrating conductive section 6821 and a second penetrating conductive section 6822. The first penetrating conductive section 6821 and the second penetrating conductive section 6822 are each a conductive section in contact with the second wiring section 320. The connecting member 69 according to the present embodiment further includes a coupling conductive section 680, a first non-penetrating conductive section 6811, and a second non-penetrating conductive section 6812. The first non-penetrating conductive section 6811 and the second non-penetrating conductive section 6812 are each a conductive section in contact with the first wiring section 310.

In this example, a primary material of the coupling conductive section 680, the first non-penetrating conductive section 6811, the second non-penetrating conductive section 6812, the first penetrating conductive section 6821 and the second penetrating conductive section 6822 is copper, but it may be tungsten. The material is not limited to those describe above, and a plurality of materials may be used for the connecting member 69. For example, aluminum may be used for the coupling conductive section 680 as the primary material, and tungsten may be used for first non-penetrating conductive section 6811, the second non-penetrating conductive section 6812, the first penetrating conductive section 6821, and the second penetrating conductive section 6822 as the primary material.

The coupling conductive section 680 mutually connects the first non-penetrating conductive section 6811, the second non-penetrating conductive section 6812, the first penetrating conductive section 6821, and the second penetrating conductive section 6822. Here, a plurality of coupling conductive sections 680 may be provided so that a first coupling conductive section connects the first non-penetrating conductive section 6811 and the first penetrating conductive section 6821, and a second coupling conductive section connects the second non-penetrating conductive section 6812 and the second penetrating conductive section 6822.

The first non-penetrating conductive section 6811 and the second non-penetrating conductive section 6812 are in contact with the first wiring section 310. In the present embodiment, the first non-penetrating conductive section 6811 and the second non-penetrating conductive section 6812 are in contact with the first metal layer 45a that constitutes part of the first wiring section 310. In the present embodiment, the first non-penetrating conductive section 6811 and the second non-penetrating conductive section 6812 each penetrate the first semiconductor substrate 10. The first non-penetrating conductive section 6811 and the second non-penetrating conductive section 6812, however, do not penetrate the first wiring structure 31. The second non-penetrating conductive section 6812 may be excluded so that there is one conductive section that is in contact with the first wiring section 310. There may be three or more conductive sections that are in contact with the first wiring section 310.

The first penetrating conductive section 6821 and the second penetrating conductive section 6822 are in contact with the second wiring section 320. In the present embodiment, the first penetrating conductive section 6821 and the second penetrating conductive section 6822 are connected to the fourth metal layer 55d that constitutes part of the second wiring section 320. In the present embodiment, the first penetrating conductive section 6821 and the second penetrating conductive section 6822 each penetrate the first semiconductor substrate 10 and further penetrate the interlayer insulating film 46 of the first wiring structure 31.

Planes A to F, illustrated in FIG. 2B, will now be described. In the plane A, the coupling conductive section 680 is enclosed by an insulating layer 62. In the plane B, the first non-penetrating conductive section 6811, the second non-penetrating conductive section 6812, the first penetrating conductive section 6821, and the second penetrating conductive section 6822 are each enclosed by the first semiconductor substrate 10. In the plane C, the first non-penetrating conductive section 6811, the second non-penetrating conductive section 6812, the first penetrating conductive section 6821, and the second penetrating conductive section 6822 are each enclosed by the interlayer insulating film 46. In the plane D, a pattern of the first metal layer 45a that constitutes the first wiring section 310 is located. Also, the first penetrating conductive section 6821 and the second penetrating conductive section 6822 are each enclosed by the interlayer insulating film 46. In the plane E, the first penetrating conductive section 6821 and the second penetrating conductive section 6822 are each enclosed by the interlayer insulating film 46. In the plane F, a pattern of the fourth metal layer 55d that that constitutes the second wiring section 320 is located.

As described above, the connecting member 69 according to the present embodiment includes conductive sections (the first penetrating conductive section 6821 and the second penetrating conductive section 6822), each of which is connected to the second wiring section 320. Note that providing a plurality of penetrating conductive sections in contact with the second wiring section 320 results in a plurality of conductive sections residing separately in a plane parallel to the semiconductor substrate as illustrated in FIG. 2B. The conductive sections have substantially an identical potential through at least the second wiring section 320. In other words, the conductive sections are electrically continuous. In this way, even if one penetrating conductive section suffers from a connection failure, the connection between the first wiring section 310 and the second wiring section 320 is secured because of another penetrating conductive section. In other words, by providing redundancy for the connection between the second wiring section 320 and the first wiring section 310, the reliability of the connection between the second wiring section 320 and the first wiring section 310 is improved. Three or more conductive sections may be in contact with the second wiring section 320. Such a connecting method enables improvement of the reliability of the electrical continuity between the first wiring section 310 and the second wiring section 320.

Also note that the redundancy is provided for both the conductive sections (the non-penetrating conductive sections) in contact with the first wiring section 310 and the conductive sections (the penetrating conductive sections) in contact with the second wiring section 320. One of the conductive sections in contact with the first wiring section 310 and the conductive section in contact with the second wiring section 320, however, may be provided with the redundancy. It is desirable, though, that at least the conductive section (the penetrating conductive section) for the second wiring section 320 be provided with the redundancy. This is because the conductive section (the penetrating conductive section) in contact with the second wiring section 320 is typically extended deeply than the conductive section in contact with the first wiring section 310, and, thus, more susceptible to the connection failure due to a foreign substance.

In a semiconductor device, a plurality of wiring sections is connected to each semiconductor element provided on the first semiconductor substrate 10. Also, a plurality of wiring sections is connected to each semiconductor element provided on the second semiconductor substrate 20. These wiring sections are paired, and a large number of groups, each of which includes a pair of wiring sections and a connecting member connecting the pair of wiring sections, is provided as the inter-substrate wiring. For example, in a case in which the image sensing region 11 includes pixels arrayed in rows and columns, and signals output from these columns are transferred in parallel to the signal processing region 22, the connecting member 69 is provided for each column. For example, in a case in which the image sensing region 11 includes a pixel array of 3000 rows×4000 columns, the number of connecting members 69 can be 4000. If even one of the 4000 connecting members 69 suffers a problem, an operation of all the 3000 pixels in the row of the one connecting member 69 will be unstable, possibly resulting in a lowered yield if the instability brings about an intolerable effect. By providing the redundancy for the connecting member 69, however, the yield can be improved.

Figure 8:
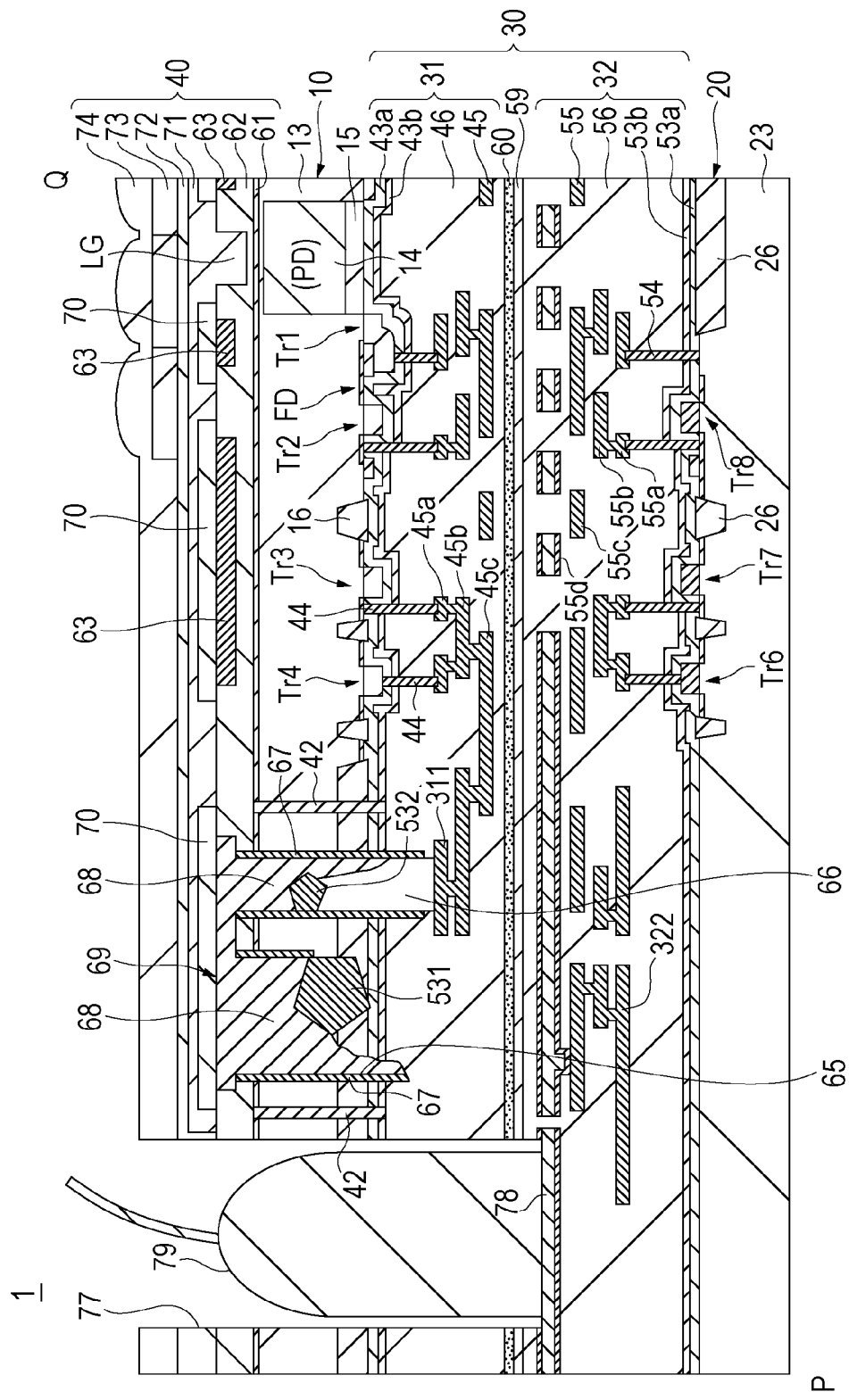
FIG. 8 is a schematic view of a semiconductor device according to a reference example.

Other components in FIG. 2A will now be described. An insulating film 67 is provided between the connecting member 69 and the semiconductor substrate 10. The insulating film 67 is provided so as to enclose each of the first non-penetrating conductive section 6811, the second non-penetrating conductive section 6812, the first penetrating conductive section 6821, and the second penetrating conductive section 6822, in order to insulate the connecting member 69 from the semiconductor substrate 10. Note that, in FIG. 2B, the insulating film 67 is not shown. An isolating section 42 electrically isolates one connecting member 69 from another connecting member 69. The isolating section 42 also electrically isolates the connecting member 69 from the semiconductor elements. Depending on the layout of the isolating section 42, the insulating film 67 may be excluded. Alternatively, the isolating section 42 may be excluded, so that the insulating film 67 insulates one connecting member 69 from another connecting member 69. In order to improve the reliability, it is desirable that the insulating film 67 and the isolating section 42 are used concurrently. The first semiconductor substrate 10 and the second semiconductor substrate 20 include element isolating sections 16 and 26, respectively, for isolating the semiconductor elements. An image sensing device 1 includes the electrode pad 78 for communicating with the outside. The electrode pad 78 is exposed from the opening 77 that penetrates the first semiconductor substrate 10, the interlayer insulating film 46, and the like. A metal wire 79 is connected to the electrode pad 78 as illustrated in FIG. 8. In this example, the connection with the outside is achieved through wire bonding. Alternatively, flip chip connection with a through-silicon via may be used.

Furthermore, in the case with the image sensing device 1, an optical structure 40 is provided on the first semiconductor substrate 10 on a side opposite to the second semiconductor substrate 20. The optical structure 40 includes an anti-reflection layer 61, the first insulating layer 62, a second insulating layer 71, a light shield 63, a cap 70, an intermediate layer 72, a color filter 73 (an on-chip color filter), and a micro lens 74 (an on-chip micro lens). The second insulating layer 71 has a higher refractive index than the first insulating layer 62. The second insulating layer 71, as a core, and the first insulating layer 62, as a clad, form an optical waveguide LG on the photodiode PD.

The footprint of a semiconductor device can be reduced by laminating a plurality of semiconductor substrates as described above, thereby contributing to reduction in size of an electronic apparatus. Another factor in the reduction in footprint is connecting the semiconductor substrates at the insides of the outer peripheries of the semiconductor substrates, not at the outsides of the outer peripheries of the semiconductor substrates through, for example, the wire bonding. The semiconductor device as an image sensing device serves an electronic apparatus such as a digital camera and an information terminal equipped with a camera function. The electronic apparatus can further include a display such as a liquid crystal display and an EL display to display an image captured by the image sensing device. The display can constitute a touch panel.

A manufacturing method for a semiconductor device will now be described on the basis of the image sensing device illustrated in FIG. 2A as an example. A typical semiconductor device (a semiconductor chip) is manufactured by forming an integrated circuit in each of regions of a semiconductor wafer including a semiconductor substrate made of silicon, and then dividing (dicing) the semiconductor wafer. The description hereinafter does not particularly differentiate between semiconductor substrates before and after the dicing.

Figure 3A:
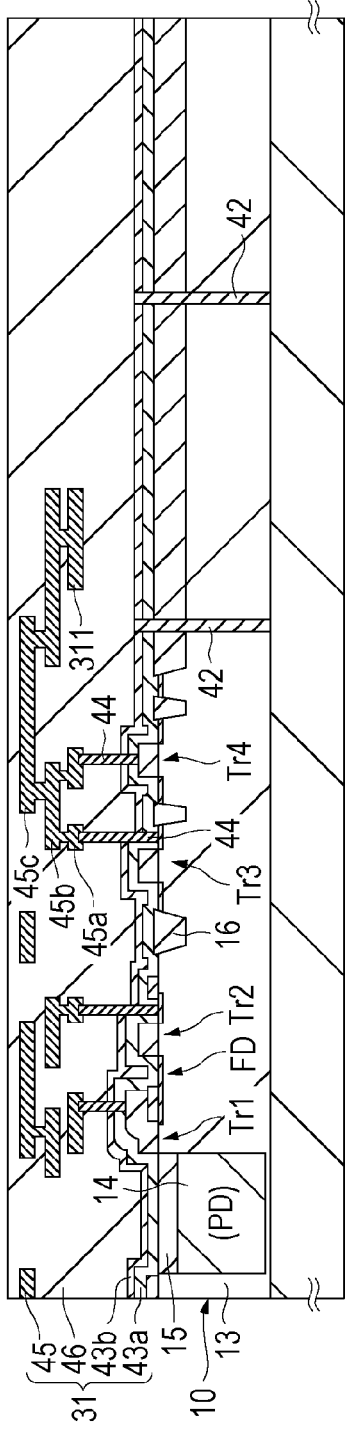
FIGS. 3A to 3C are schematic views of an exemplary manufacturing method for the semiconductor device.

As illustrated in FIG. 3A, the image sensing region and the control region are formed in the first semiconductor substrate 10. The photodiode PD is constituted by an N-type semiconductor region 14 and a P-type semiconductor region 15 that is located toward a side of a surface of the substrate. The N-type semiconductor region 14 and the P-type semiconductor region 15 are formed in a P-type semiconductor region 13 as a well region (or a substrate). A gate electrode is formed on the surface of the substrate with a gate insulating film interposed therebetween. Source/drain regions corresponding to the gate electrode are created to form a MOS transistor. In FIG. 3A, two transistors Tr1 and Tr2 are illustrated to represent a plurality of MOS transistors of a pixel circuit. The transistor Tr1 adjacent to the photodiode (PD) corresponds to a transfer transistor and the drain region of the transistor Tr1 corresponds to a floating diffusion (FD). The transistor Tr2 corresponds to a reset transistor. Each unit of pixels is isolated by the element isolating section 16.

In the control region 12, a plurality of MOS transistors that constitutes a control circuit is formed. In FIG. 3A, two transistors Tr1 and Tr4 are illustrated to represent a plurality of MOS transistors of a drive circuit.

The surface insulating film is then formed on the surface of the first semiconductor substrate 10 by laminating successively the first surface insulating layer 43a made of silicon oxide and the second surface insulating layer 43b made of silicon nitride. Furthermore, a first layer of the interlayer insulating film 46, which is a multilayer film, is formed. Subsequently, a contact hole is formed in the first insulating layer of the interlayer insulating film 46 and the surface insulating layers. The contact hole is filled with a material, such as tungsten, to form the contact plug 44 that is to be connected to an appropriate transistor. The second surface insulating layer 43b functions as an etching stopper while the contact hole is formed.

In addition, after the second surface insulating layer 43b is formed, the isolating section 42 is formed to isolate a desired region in the P-type semiconductor region 13 of the first semiconductor substrate 10. The isolating section 42 is formed, after the formation of the second surface insulating layer 43b, by forming an opening in the first semiconductor substrate 10 from the side of the surface thereof at a desired location and filling the opening with an insulating material. The isolating section 42 is formed in a region that is to enclose the connecting member 69 to be formed later.

Then, a plurality of metal layers (three layers in this example) is formed with insulating layers of the interlayer insulating film interposed therebetween to form the first wiring structure 31. The plurality of metal layers is formed so as to be in contact with the contact plug 44. In the case in which the primary material of the metal layers is the copper, each metal layer can include a barrier metal layer made of Ti and/or TiN, and the interlayer insulating film can include an anti-diffusion layer made of a material, such as SiN and SiC. A copper conductive line is formed with a publicly known method such as a damascene process.

In the steps described above, a first semiconductor wafer 111, which includes the first semiconductor substrate 10 and the first wiring structure 31, is formed as an intermediate structure, in other words, a first component. The first semiconductor substrate 10 is provided with the image sensing region 11 and the control region 12. The first wiring structure 31 includes a first conductive line 311. The first conductive line 311 will be the first wiring section 310 of the inter-substrate wiring after the formation of the connecting member 69, which is to be described hereinafter. The first conductive line 311 is supported, as part of the first wiring structure 31, by the first semiconductor substrate 10.

Figure 3B:
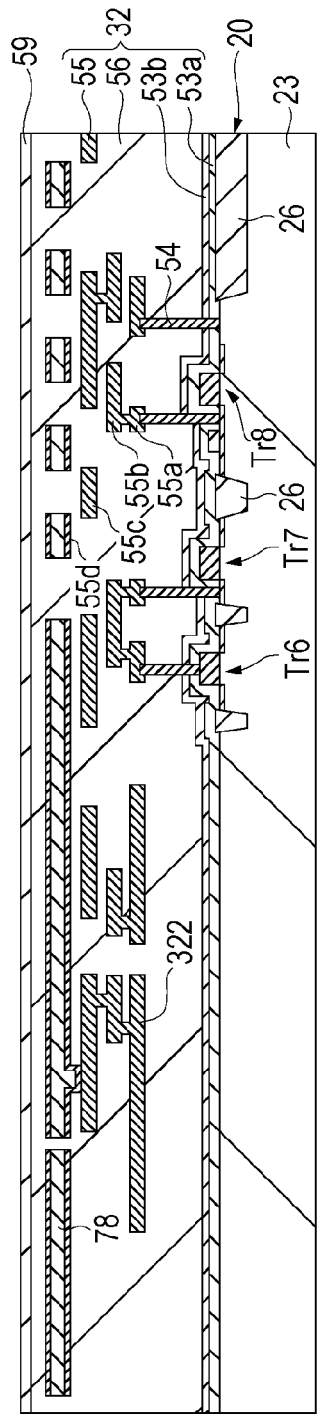

Meanwhile, the signal processing region is formed in the second semiconductor substrate 20 as illustrated in FIG. 3B. In other words, a plurality of MOS transistors that constitutes a signal processing circuit is formed in a P-type semiconductor region 23 on a surface of the second semiconductor substrate 20 such that the plurality of MOS transistors is isolated by the element isolating section 26. Here, the plurality of MOS transistors is represented by the transistors Tr6, Tr7, and Tr8. A logic circuit can have a CMOS (Complementary Metal Oxide Semiconductor) structure.

The surface insulating film is then formed on the surface of the second semiconductor substrate 20 by laminating successively the first surface insulating layer 53a and the second surface insulating layer 53b. Similarly to the first wiring structure 31, the contact plug 54, the group of metal layers 55, and the interlayer insulating film 56 are formed. The fourth metal layer 55d, which contains the aluminum as the primary material, can include a barrier metal made of Ti and/or TiN.

It is desirable that a stress reducing film 59 be formed on the second wiring structure 32. The stress reducing film 59 is for relieving warpage that can occur while the first semiconductor substrate 10 and the second semiconductor substrate 20 are bonded. The stress reducing film 59 may be formed by, for example, forming a P—SiN film or a P—SiON film (a plasma oxynitride film) to have a thickness of 100 to 2000 nm.

In the steps described above, a second semiconductor wafer 222, which includes the second semiconductor substrate 20 and the second wiring structure 32 is formed as an intermediate structure, in other words, a second component. The second semiconductor substrate 20 is provided with the signal processing region 22. The second wiring structure 32 includes a second conductive line 322. The second conductive line 322 will be the second wiring section 320 of the inter-substrate wiring after the formation of the connecting member 69, which is to be described hereinafter. The second conductive line 322 is supported, as part of the second wiring structure 32, by the second semiconductor substrate 20.

Figure 3C:
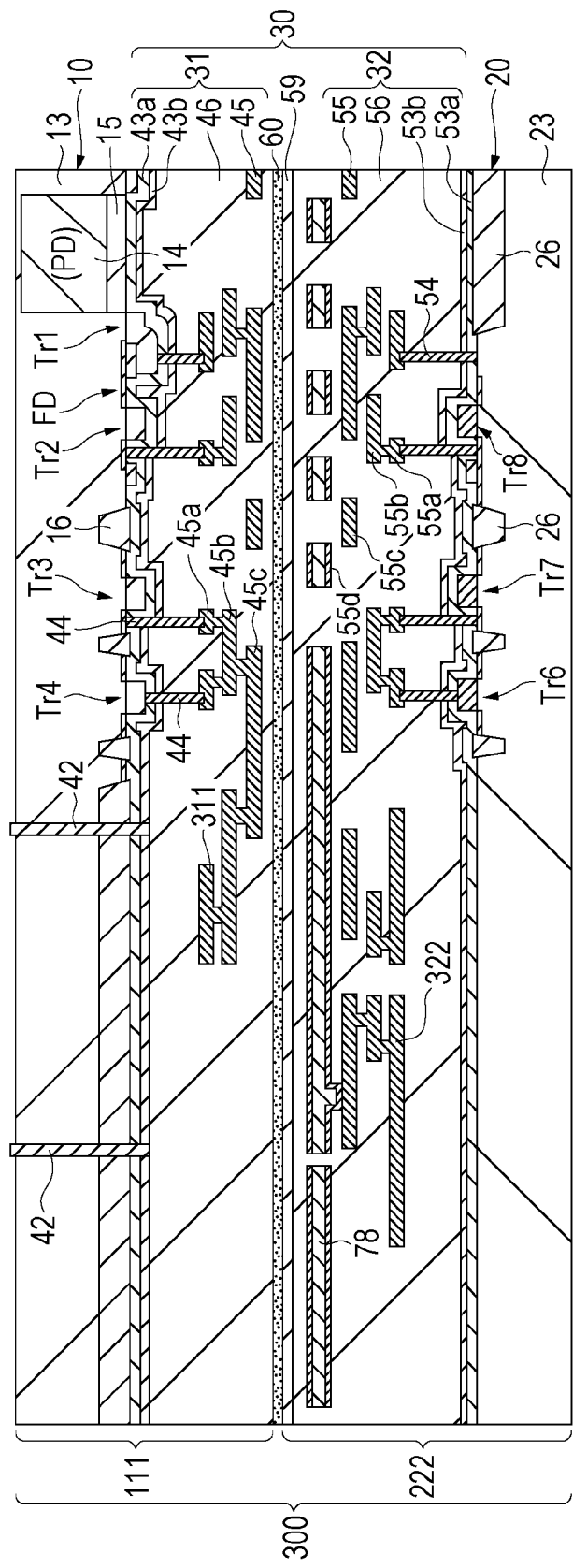

The first semiconductor wafer 111 and the second semiconductor wafer 222 are then laminated and bonded to be joined together as illustrated in FIG. 3C. In this example, the first semiconductor wafer 111 and the second semiconductor wafer 222 are joined such that the first wiring structure 31 and the second wiring structure 32 are located between the first semiconductor substrate 10 and the second semiconductor substrate 20. The bonding is performed with, for example, an adhesive. In this example, the first semiconductor substrate 10, provided with the image sensing region, is located at an upper part and the second semiconductor substrate 20 is located at a lower part when bonded together.

In this example, the first wiring structure 31, which is located on the first semiconductor substrate 10, is bonded with the second wiring structure 32, which is located on the second semiconductor substrate 20, with the attaching layer 60 interposed therebetween. Alternatively, the bonding may be achieved through a plasma joining technique. In the case with the plasma joining technique, a plasma TEOS film, a plasma SiN film, a SiON film (a block film), or a SiC film is formed on each joining surface of the first wiring structure 31 and the second wiring structure 32. The joining surfaces, each with the film formed thereon, are processed with plasma and put against each other. Subsequently, the joining surfaces are subjected to an anneal process to be joined. The bonding is preferably performed in a low-temperature process having a temperature not more than 400° C., which does not affect a conductive line and the like. By laminating and bonding the first semiconductor substrate 10 and the second semiconductor substrate 20, a laminate 300 of the two semiconductor wafers is formed. The first conductive line 311 and the second conductive line 322 in this state are not electrically continuous.

The connecting member 69 is then formed in the laminate 300 prepared as described above. The connecting member 69 is for providing electrical continuity between the first conductive line 311 and the second conductive line 322. The first semiconductor substrate 10 is processed from a backside thereof with mechanical polishing, chemical mechanical polishing (CMP), wet etching, or dry etching in order to reduce a thickness of the first semiconductor substrate 10. The thickness of the first semiconductor substrate 10 is, for example, approximately 600 μm before the reducing. The thickness of the first semiconductor substrate 10 is, for example, not more than 10 μm, and typically, approximately 3 to 5 μm after the reduction. In the present embodiment, the reducing of the thickness of the first semiconductor substrate 10 is performed with the second semiconductor substrate 20, which includes the signal processing region 22, used as a supporting substrate. The backside of the first semiconductor substrate 10 will be a light entry surface, so that an image sensing device of a so-called backside illumination type can be obtained. The reduction in thickness is not always demanded depending on the application of a semiconductor device. The reduction in thickness of the first semiconductor substrate 10, however, can reduce a time for forming a penetrating connection hole and a non-penetrating connection hole, which is to be described hereinafter.

Figure 3D:
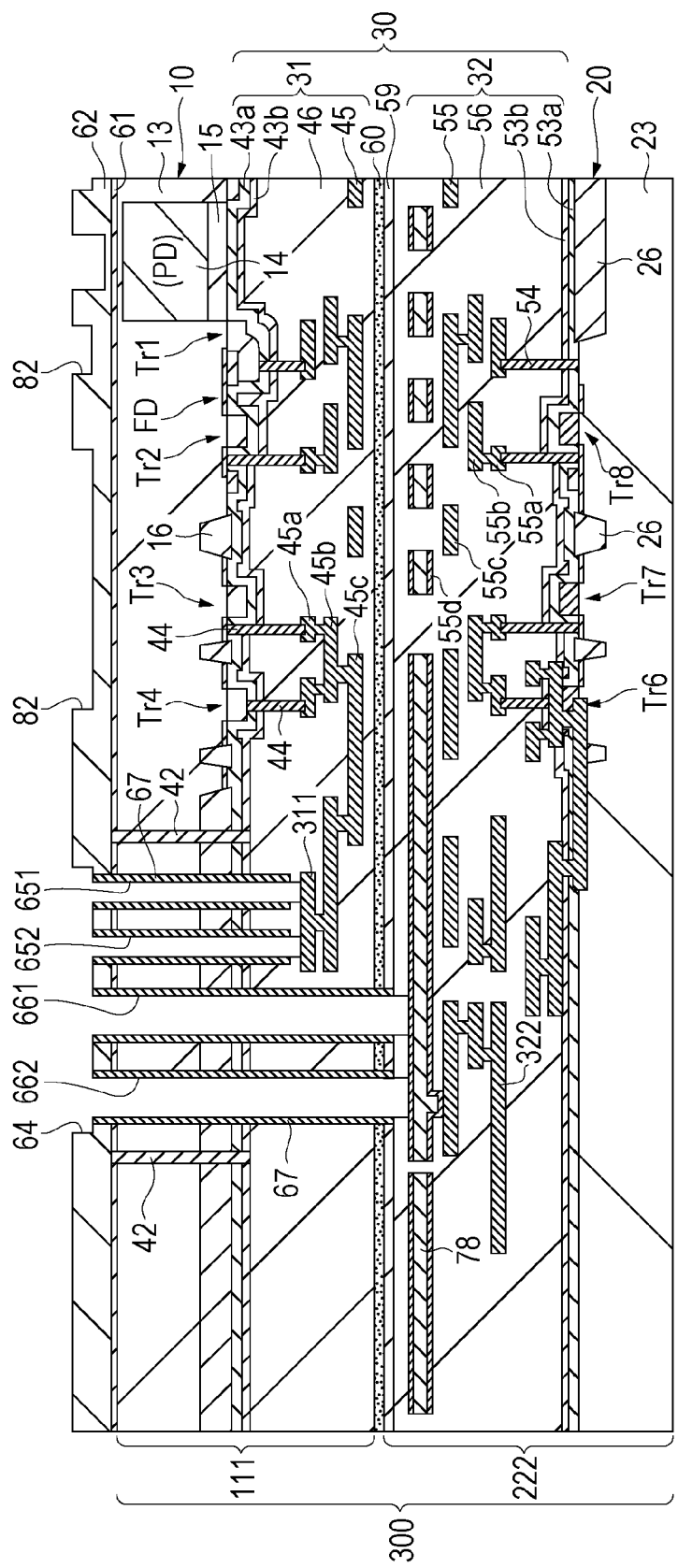
FIGS. 3D to 3F are schematic views of the exemplary manufacturing method for the semiconductor device.

The anti-reflection layer 61 is then formed on the backside of the first semiconductor substrate 10 as illustrated in FIG. 3D. The anti-reflection layer 61 can be formed with, for example, SiN, $TaO_2$, or $HfO_2$ to have a thickness of 5 to 100 nm. By performing a heat treatment, an effect of suppressing a dark current can be added. Subsequently, the first insulating layer 62 is formed on the anti-reflection layer 61 by forming a plasma SiO film to have a thickness of 100 to 1500 nm.

Furthermore, as illustrated in FIG. 3D, a coupling groove 64 is formed at a desired region inside the isolating section 42. Also, a light shield groove 82 is formed at a region to be a light-shielded region in which light should be shielded. The coupling groove 64 and the light shield groove 82 are formed by etching the first insulating layer 62 from a top side thereof to form an opening. The first insulating layer 62 has been formed on the backside of the first semiconductor substrate 10. The opening is formed to have a depth that, for example, does not reach the first semiconductor substrate 10.

Furthermore, as illustrated in FIG. 3D, perforation is performed from a desired bottom region in the coupling groove 64, which is formed inside the isolating section 42, to obtain a depth that almost reaches any metal layer (in this example, the first metal layer 45a, which is the closest to the first semiconductor substrate 10) of the group of metal layers 45 in the first wiring structure 31. The perforation can be performed by the dry etching using a mask pattern provided on a backside of the first semiconductor wafer 111 (a side opposite to the first wiring structure 31 with respect to the first semiconductor substrate 10). A first non-penetrating connection hole 651 and a second non-penetrating connection hole 652 are formed in accordance with the mask pattern to reach the first conductive line 311. The first non-penetrating connection hole 651 and the second non-penetrating connection hole 652 preferably have depths that at least penetrate the first semiconductor substrate 10. In the illustrated example, two non-penetrating connection holes are provided. Alternatively, one hole, or three or more holes, may be provided.

Similarly, the perforation is performed from a desired bottom region in the coupling groove 64, which has been formed inside the isolating section 42, to obtain a depth that almost reaches any metal layer (in this example, the fourth metal layer 55d, which is the farthest from the second semiconductor substrate 20) of the group of metal layers 55 in the second wiring structure 32. The perforation can be performed by the dry etching using a mask pattern provided on the backside of the first semiconductor wafer 111 (the side opposite to the first wiring structure 31 with respect to the first semiconductor substrate 10). A first penetrating connection hole 661 and a second penetrating connection hole 662 are formed in accordance with the mask pattern to reach the second conductive line 322. The mask pattern may be formed of an organic material. The use of an inorganic material as a so-called hard mask, however, can facilitate the formation of the connection holes. In addition, the connection holes are formed after the bonding in this example. Alternatively, the first semiconductor wafer 111, before it is bonded, may be provided with the holes having appropriate depths in advance.

The first non-penetrating connection hole 651 and the second non-penetrating connection hole 652, as well as the first penetrating connection hole 661 and the second penetrating connection hole 662, are formed from the side of the first semiconductor wafer 111 opposite to the second semiconductor wafer 222 toward the first conductive line 311 and the second conductive line 322. The first penetrating connection hole 661 and the second penetrating connection hole 662 are formed from the side of the first semiconductor wafer 111, not from the side of the second semiconductor wafer 222, in order to facilitate the connection with the first conductive line 311.

The depths of the first penetrating connection hole 661 and the second penetrating connection hole 662, which almost reach the second conductive line 322, preferably penetrate at least the first semiconductor substrate 10. It is preferable that the depths of the first penetrating connection hole 661 and the second penetrating connection hole 662 also penetrate the first wiring structure 31. In the illustrated example, two penetrating connection holes are provided. Alternatively, one hole, or three or more holes, may be provided.

The penetrating connection holes (the first penetrating connection hole 661 and the second penetrating connection hole 662) are formed more deeply than the non-penetrating connection holes (the first non-penetrating connection hole 651 and the second non-penetrating connection hole 652). These connection holes with different depths may be formed simultaneously. It is, however, preferable that these connection holes be formed at separate phases, and in this case, the penetrating connection holes are preferably formed before the formation of the non-penetrating connection holes for reasons to be described below. The defective formation of a connection hole may be caused by the foreign substance 531 as illustrated in FIG. 8. A by-product produced during the formation of a preceding connection hole may turn to a foreign substance to the formation of a succeeding connection hole. The foreign substances 531 and 532 may deposit on the laminate 300 at various timings. In particular, a foreign substance, which is produced during processing inside a forming apparatus for a connection hole or a film forming apparatus for a conductive material, is less likely to be removed by washing or the like, and thus has a significant effect on the perforation of the connection hole and the filling of the conductive material. The by-product is more likely to be produced during the formation of a deep connection hole (a penetrating connection hole) in comparison with the formation of a shallow connection hole (a non-penetrating connection hole). In addition, a foreign substance is more likely to cause the defective formation during the formation of a deep connection hole (a penetrating connection hole) in comparison with the formation of a shallow connection hole (non-penetrating connection hole). Forming a deep connection hole earlier, therefore, can facilitate the formation of the deep connection hole.

The penetrating connection holes 661 and 662 are preferably formed to have diameters 1.5 to 10 times larger than those of the first non-penetrating connection hole 651 and the second non-penetrating connection hole 652. More preferably, the penetrating connection holes 661 and 662 are formed to have diameters 3 to 4 times larger than those of the first non-penetrating connection hole 651 and the second non-penetrating connection hole 652. Note that the diameters of the penetrating connection holes and the non-penetrating connection holes should be compared on an identical plane parallel to the second semiconductor substrate 20.

If the first penetrating connection hole 661 and the second penetrating connection hole 662 have diameters smaller than 1.5 times that of the first non-penetrating connection hole 651 and the second non-penetrating connection hole 652, the first penetrating connection hole 661 and the second penetrating connection hole 662 have increased aspect ratios. This may result in a void caused at a later phase to fill the holes with the conductive material. If the first penetrating connection hole 661 and the second penetrating connection hole 662 have diameters larger than 10 times that of the first non-penetrating connection hole 651 and the second non-penetrating connection hole 652, the first penetrating connection hole 661 and the second penetrating connection hole 662 occupy an increased area. This may preclude the reduction in size of a device. Hence, it is preferable that the first penetrating connection hole 661 and the second penetrating connection hole 662 have diameters 1.5 to 10 times larger than that of the first non-penetrating connection hole 651 and the second non-penetrating connection hole 652. This allows a hole that has an aspect ratio most suitable for the filling of a conductive material and prevents an increase in a layout space.

The first non-penetrating connection hole 651 and the second non-penetrating connection hole 652, and the first penetrating connection hole 661 and the second penetrating connection hole 662 are formed after the thickness reduction of the first semiconductor substrate 10. This reduces the aspect ratios and allows the holes to be formed as fine pores. Here, if the thickness reduction is not performed, the first non-penetrating connection hole 651 and the second non-penetrating connection hole 652 can be formed in advance before the bonding step. In addition, the first non-penetrating connection hole 651 and the second non-penetrating connection hole 652 are formed by forming openings to almost reach a lowermost layer in the first wiring structure 31 on the top of the first semiconductor substrate 10, in other words, the first metal layer 45a, which is the closest to the first semiconductor substrate 10. Hence, the openings have shallow depths, which is advantageous to the formation of fine pores. A plurality of openings is formed for one paired connection, which can reduce the occurrence of poor conductivity due to a foreign substance, a void, an alignment failure, and the like. Note that, in this example, the penetrating connection holes and the non-penetrating connection holes are of cylindrical shapes having constant diameters in a depth direction. The penetrating connection holes and/or the non-penetrating connection holes may be forward tapered to have diameters reducing toward the conductive lines, in order to facilitate the filling of a conductive material.

The insulating film 67, made of, for example, a $SiO_2$ film, is then formed in a region including a side wall and a bottom of each of the first non-penetrating connection hole 651 and the second non-penetrating connection hole 652, and the first penetrating connection hole 661 and the second penetrating connection hole 662. Subsequently, the insulating film 67 is etched back. In this way, the insulating film 67 are provided on the respective side wall of the first non-penetrating connection hole 651 and the second non-penetrating connection hole 652, and the first penetrating connection hole 661 and the second penetrating connection hole 662, while the insulating film 67 being removed from on the respective bottom of the holes, as illustrated in FIG. 3D. Subsequently, the bottom of each of the first non-penetrating connection hole 651 and the second non-penetrating connection hole 652, and the first penetrating connection hole 661 and the second penetrating connection hole 662 is further etched for removal. In this way, a metal layer (the first metal layer 45a) in the first wiring structure 31 is exposed in the first non-penetrating connection hole 651 and the second non-penetrating connection hole 652, and a metal layer (the fourth metal layer 55d) in the second wiring structure 32 is exposed in the first penetrating connection hole 661 and the second penetrating connection hole 662.

As a result, the first non-penetrating connection hole 651 and the second non-penetrating connection hole 652 reach the first metal layer 45a of the first conductive line 311 provided in the first wiring structure 31. Also, the first penetrating connection hole 661 and the second penetrating connection hole 662 penetrate the first wiring structure 31 and the joining surface (the attaching layer 60) of the second wiring structure 32 to reach the fourth metal layer 55d of the second conductive line 322 provided in the second wiring structure 32. Here, part of the second wiring structure 32 should be perforated in addition to the first wiring structure 31, so that a penetrating connection hole reaches a metal layer embedded in the second wiring structure 32. If, however, the second conductive line 322 in the second semiconductor wafer 222 is exposed at a surface of the second wiring structure 32, perforating the first semiconductor substrate 10 and the first wiring structure 31 is sufficient, and hence the second semiconductor wafer 222 does not have to be perforated. Furthermore, if the first conductive line 311 is exposed at a surface of the first wiring structure 31, the formation of the non-penetrating connection hole may be excluded.

Figure 3E:
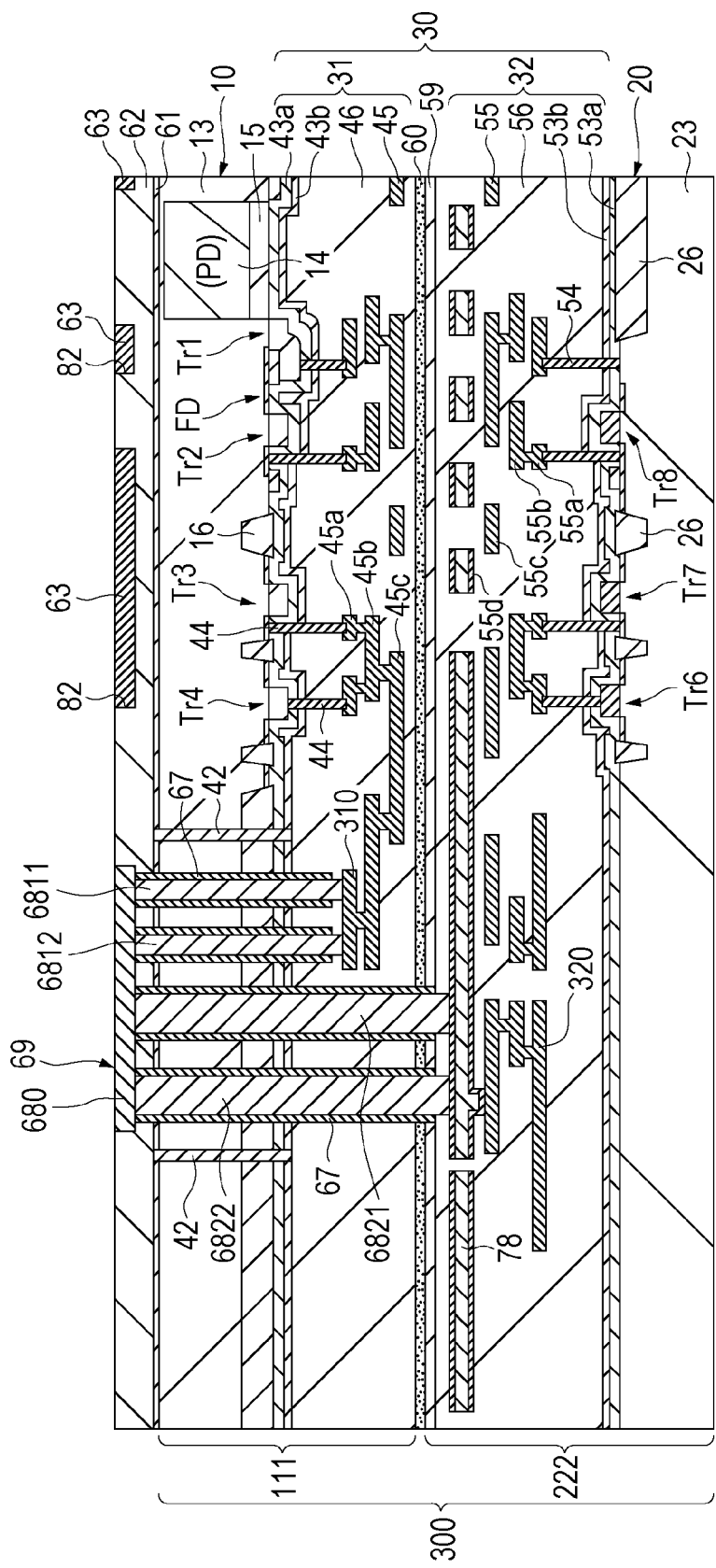

Subsequently, as illustrated in FIG. 3E, a conductive material, such as copper and tungsten, is deposited in regions including the coupling groove 64, the light shield groove 82, the first non-penetrating connection hole 651 and the second non-penetrating connection hole 652, and the first penetrating connection hole 661 and the second penetrating connection hole 662. A surface is then polished with the CMP (Chemical Mechanical Polishing) to remove an excess conductive material. In this way, the conductive material present inside the coupling groove 64, the light shield groove 82, the first non-penetrating connection hole 651 and the second non-penetrating connection hole 652, and the first penetrating connection hole 661 and the second penetrating connection hole 662 survives. In other words, the connecting member 69 is formed with a so-called damascene process. In this example, a dual damascene process is employed, in which a groove (a trench) and a hole (a via) are both formed and then filled with a conductive material. In addition, in this example, a trench-first dual-damascene process is used, in which the groove (the trench) is formed before the hole (the via). A via-first dual-damascene process may also be used, in which the hole (the via) is formed before the groove (the trench). Here, a plating method may be used for filling the copper as the conductive material, and a sputtering method or a CVD method may be used for filling the tungsten. The light shield 63 is also formed through the damascene process. In this way, the coupling groove 64, the light shield groove 82, the first non-penetrating connection hole 651 and the second non-penetrating connection hole 652, and the first penetrating connection hole 661 and the second penetrating connection hole 662 are filled with the conductive material. The group of metal layers 45 formed in the first wiring structure 31 and the group of metal layers 55 formed in the second wiring structure 32 are electrically connected. This creates the connecting member 69 in the region inside the isolating section 42 and the light shield 63 in the light-shielded region. The non-penetrating conductive sections 6811 and 6812 are formed in the first non-penetrating connection hole 651 and the second non-penetrating connection hole 652, respectively. The penetrating conductive sections 6821 and 6822 are formed in the first penetrating connection hole 661 and the second penetrating connection hole 662, respectively. The coupling conductive section 680, which is formed in the coupling groove 64 and includes damascene wiring, electrically connects the non-penetrating conductive sections 6811 and 6812 and the penetrating conductive sections 6821 and 6822.

At this point, the fourth metal layer 55d, formed in the second wiring structure 32 on the second semiconductor substrate 20, is provided with the barrier metal layer. Hence, even if the connecting member 69 is made of copper, the diffusion of the copper is prevented. In addition, the side walls, which are located inside the first non-penetrating connection hole 651 and the second non-penetrating connection hole 652, and the first penetrating connection hole 661 and the second penetrating connection hole 662, and penetrate the first semiconductor substrate 10, are provided with the insulating films 67. Hence, the connecting member 69 and the first semiconductor substrate 10 are electrically isolated from each other, and will not be connected with each other. In addition, in this example of the present embodiment, the connecting member 69 is formed inside the isolating section 42 provided in the first semiconductor substrate 10, which also prevents the electrical connection between the connecting member 69 and the first semiconductor substrate 10.

In the step to form the connecting member 69 according to this example of the present embodiment, the coupling groove 64, the light shield groove 82, the first non-penetrating connection hole 651 and the second non-penetrating connection hole 652, and the first penetrating connection hole 661 and the second penetrating connection hole 662 are formed in three separate phases using the damascene process to fill the copper. This, however, is not intended to be limiting. Various modifications are possible as long as the connecting member 69 is formed to electrically connect the first metal layer 45a, located in the first wiring structure 31 on the top of the first semiconductor substrate 10, and the fourth metal layer 55d, located in the second wiring structure 32 on the top of the second semiconductor substrate 20.

For example, the connecting member 69 can be deposited with the CVD method or the sputtering method, and formed with typical lithography and the dry etching. In this way, however, sensitivity degradation due to the deposition of metal layers will be less likely to be tolerable. Hence, it is desirable that a damascene wiring structure with minimized lamination of insulating films be used.

Furthermore, in this example, the light shield groove 82, which is for forming the light shield 63, is formed simultaneously with the coupling groove 64, which is for forming the connecting member 69. The light shield groove 82 may be, however, formed after the formation of the coupling groove 64, the first non-penetrating connection hole 651 and the second non-penetrating connection hole 652, the first penetrating connection hole 661 and the second penetrating connection hole 662, and the isolating section 42. In this case, the light shield groove 82 is formed on a layer identical to that of the coupling groove 64. Also, the light shield groove 82 is filled with the conductive material simultaneously with the coupling groove 64, the first non-penetrating connection hole 651 and the second non-penetrating connection hole 652, and the first penetrating connection hole 661 and second penetrating connection hole 662. Processing the light shield groove 82 simultaneously with the coupling groove 64, the first non-penetrating connection hole 651 and the second non-penetrating connection hole 652, and the first penetrating connection hole 661 and the second penetrating connection hole 662 simplifies steps. In this case, though, during the formation of the isolating section 42, an isolating section 42 may be formed also inside the light shield groove 82, which may lead to failure to provide a desired line width of the light shield 63. With smaller pixels, it is desirable that the light shield groove 82 be formed in a separate phase from the coupling groove 64, the first non-penetrating connection hole 651 and the second non-penetrating connection hole 652, and the first penetrating connection hole 661 and the second penetrating connection hole 662.

The light shield 63 can be formed with tungsten, aluminum, or the like in a separate step prior to forming the connecting member 69. Forming the light shield 63 through the damascene process simultaneously with the formation of the connecting member 69, however, can simplify steps. This also allows the reduction in thickness of the insulating layers (e.g. the insulating layer 62) located at the side of a light receiving section (the backside) of the first semiconductor substrate 10, contributing to an improvement of the sensitivity.

The first penetrating connection hole 661 and the second penetrating connection hole 662 have depths 1.5 to 10 times deeper than those of the first non-penetrating connection hole 651 and the second non-penetrating connection hole 652. Hence, even when the first non-penetrating connection hole 651 and the second non-penetrating connection hole 652 are successfully filled with the conductive material, the first penetrating connection hole 661 and the second penetrating connection hole 662, each having an identical opening size with the first non-penetrating connection hole 651 and the second non-penetrating connection hole 652, may have a void.

In this example of the present embodiment, the first penetrating connection hole 661 and the second penetrating connection hole 662, and the first non-penetrating connection hole 651 and the second non-penetrating connection hole 652 are formed with different opening sizes depending on the depths thereof. This allows the formation of the holes that have aspect ratios most suitable for the filling of the conductive material and prevent an increase in the layout space. This can prevent a void caused during the filling of the conductive material in the first penetrating connection hole 661 and the second penetrating connection hole 662, which are deep.

Furthermore, in this example of the present embodiment, the first non-penetrating connection hole 651 and the second non-penetrating connection hole 652 are connected to the first metal layer 45a, which is the lowermost layer in the first wiring structure 31 on the first semiconductor substrate 10. Hence, a space near the first non-penetrating connection hole 651 and the second non-penetrating connection hole 652, or a space deeper than the first non-penetrating connection hole 651 and the second non-penetrating connection hole 652 can be used as an effective space that allows routing of a conductive line. This is advantageous for shrinkage of a chip.

Note that, in this example of the present embodiment, the connecting member 69 is insulated from the first semiconductor substrate 10 by the insulating film 67 and the isolating section 42. The insulation, however, may be provided by either one of the insulating film 67 and the isolating section 42. When the isolating section 42 is not formed, the region for the isolating section 42 is eliminated, allowing a reduction in area of pixels and an increase in area of the photodiode (PD).

Figure 3F:
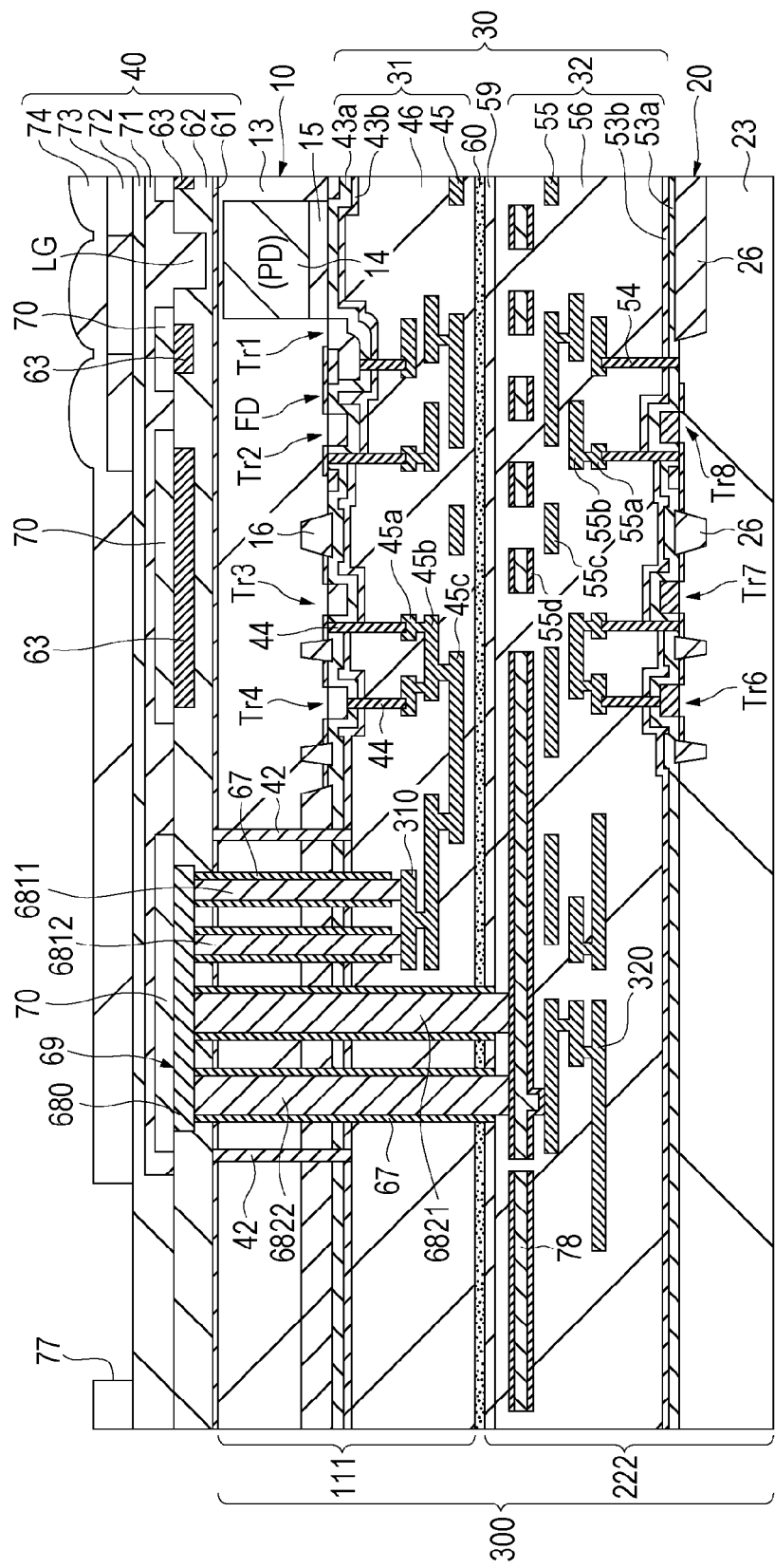

As illustrated in FIG. 3F, caps 70, which are each a SiN film or a SiCN film having a thickness of 10 to 150 nm, are then formed so as to cover the tops of the connecting member 69 and the light shield 63. Subsequently, an opening is formed in the insulating layer 62, which has a low refractive index and is located above the photodiode (PD). The high-refractive insulating layer 71, having a refractive index higher than that of the insulating layer 62, is formed in a desired region including the opening. The high-refractive insulating layer 71 may be, for example, formed of SiN or resin. This forms the optical waveguide LG with the high-refractive insulating layer 71 formed in the opening as the core and the low-refractive insulating layer 62 as the clad. The optical waveguide LG, thus formed, allows efficient collection of the light entering through the backside of the first semiconductor substrate 10 into the photodiode (PD). Subsequently, the intermediate layer 72 is formed over an entire surface including the insulating layer 62 for planarization. In this example of the present embodiment, the caps 70 and the insulating layer 71 are formed separately in individual steps, but the insulating layer 71 may serve as the caps 70. Also in this example of the present embodiment, the optical waveguide LG is formed on the side of the light entry surface of the photodiode (PD). The optical waveguide LG, however, may be excluded.

Furthermore, as illustrated in FIG. 3F, the color filter 73, having optical transparency to, for example, red (R), green (G), and blue (B), is formed on the intermediate layer 72 in accordance with each pixel. The color filter 73 can be formed by forming and patterning an organic film containing a pigment or a dye of a desired color. The color filter 73 can be formed above the photodiode (PD) constituting a desired pixel array. The color filter 73 may, in addition to a light transmitting section that filters light of primary colors selectively, include a light transmitting section that filters light of colors complementary to the primary colors or white light. Subsequently, the micro lens 74 is formed in the image sensing region that includes the top of the color filter 73.

Subsequently, the insulating layer 62 and the like formed on the top of the first semiconductor substrate 10 are etched to expose the first semiconductor substrate 10. The first semiconductor substrate 10 and the interlayer insulating film 46 are further etched successively to form the opening 77, as illustrated in FIG. 2A, so that the fourth metal layer 55$d$, formed in the second wiring structure 32 on the top of the second semiconductor substrate 20, is exposed. The fourth metal layer 55$d$, thus exposed, constitutes the electrode pad 78 that is used to establish a connection with external wiring. Subsequently, the laminate 300, which is formed by joining the two semiconductor wafers, is subjected to the dicing process with the first semiconductor wafer 111 and the second semiconductor wafer 222 of the laminate 300 together, so that the laminate 300 is divided into chips. A divided first semiconductor wafer 111 constitutes the first member 100 and a divided second semiconductor wafer 222 constitutes the second member 200. In this way, the semiconductor device 1, provided with the first member 100, the second member 200, and the connecting member 69, is obtained. The semiconductor device 1, formed as described above, is provided with a bonding wire connected to the electrode pad 78 in a similar manner as illustrated in FIG. 8. Note that the first semiconductor wafer 111 and the second semiconductor wafer 222 may be diced separately. In this case, a first chip, obtained by dicing the first semiconductor wafer 111, can be the first component, and a second chip, obtained by dicing the second semiconductor wafer 222, can be the second component. In other words, it is also possible to bond the first chip and the second chip and then form the connecting member 69.

Figure 4A:
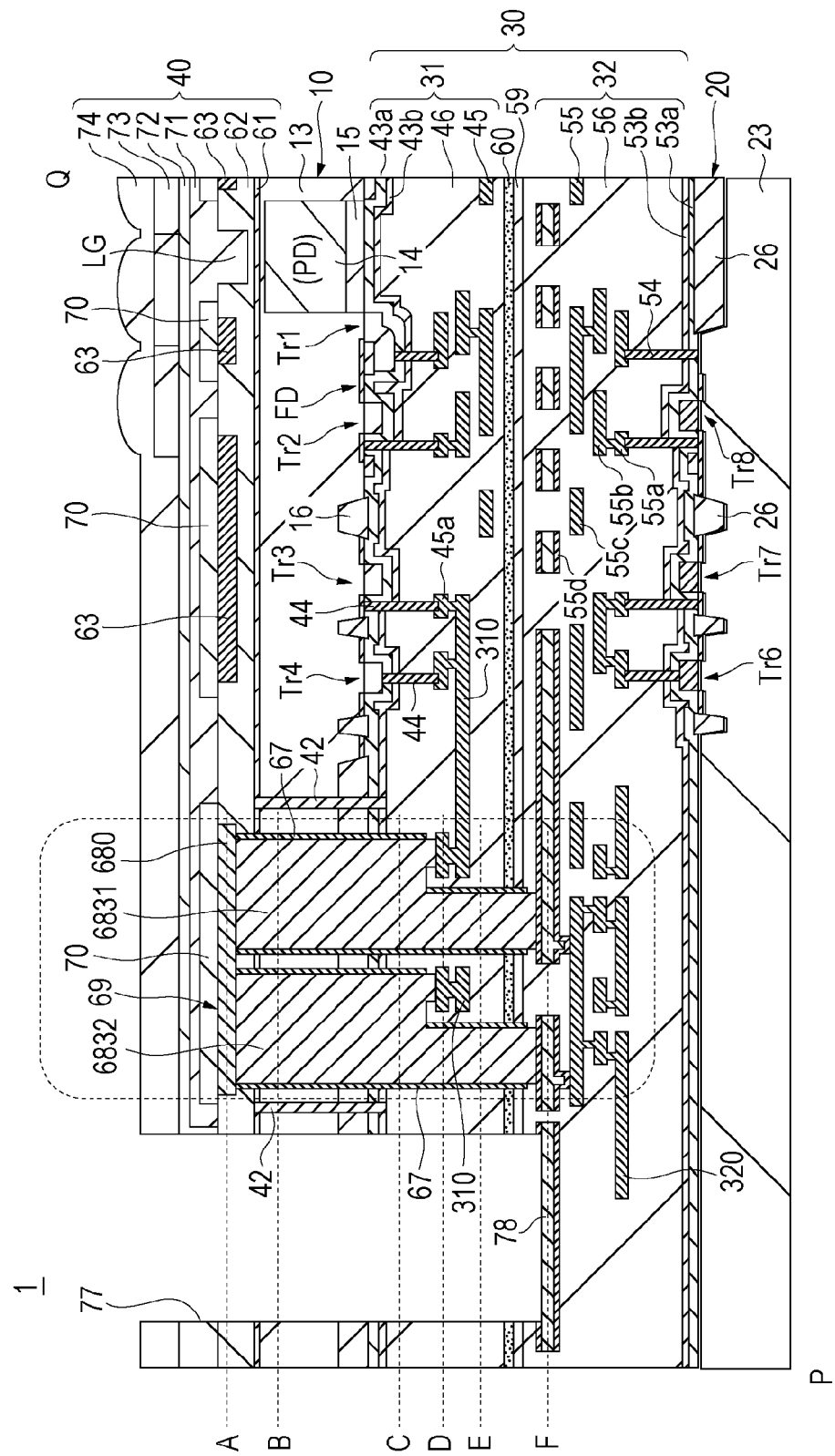
FIGS. 4A and 4B are schematic views of an exemplary semiconductor device.
Figure 4B:
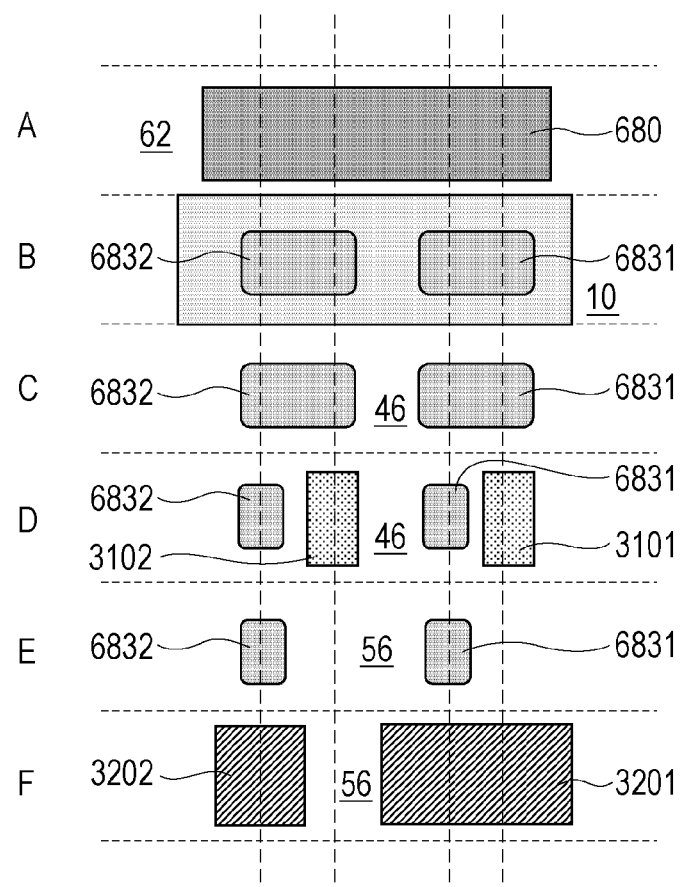

An example of a second embodiment will be now described with reference to FIGS. 4A and 4B. FIG. 4A is a cross-sectional view of a configuration as illustrated in FIG. 1B taken along the line P-Q of FIG. 1A. FIG. 4B is a diagram of plan views of part (including a connecting member 69) of FIG. 4A enclosed by a broken line at positions A, B, C, D, E, and F. Except for an arrangement of the connecting member 69, the present embodiment is similar to the first embodiment and, hence, the description thereof will not be repeated.

The connecting member 69 according to the second embodiment includes a first common penetrating conductive section 6831 and a second common penetrating conductive section 6832. The first common penetrating conductive section 6831 and the second common penetrating conductive section 6832 are each connected to a first wiring section 310 and a second wiring section 320. The first common penetrating conductive section 6831 corresponds to a combination of the first non-penetrating conductive section 6811 and the first penetrating conductive section 6821, provided separately in the first embodiment, and serves as the first non-penetrating conductive section 6811 and the first penetrating conductive section 6821. Similarly, the second common penetrating conductive section 6832 corresponds to a combination of the second non-penetrating conductive section 6812 and the second penetrating conductive section 6822, provided separately in the first embodiment. In this way, by providing a plurality of conductive sections (common penetrating conductive sections) that is connected to both the first wiring section 310 and the second wiring section 320, the redundancy of the connecting member 69 is increased, thereby improving the reliability of the electrical continuity. Here, when the common penetrating conductive sections are used, the coupling conductive section may be excluded. In addition to a common penetrating conductive section, a non-penetrating conductive section connected solely to the first wiring section 310 and a penetrating conductive section connected solely to the second wiring section 320 may also be provided. Furthermore, in the present embodiment, the second wiring section 320 is divided into a first pattern 3201 and a second pattern 3202. The first pattern 3201 and the second pattern 3202 are each part of the identical second wiring section 320 and formed in an identical fourth metal layer 55$d$. The first pattern 3201 and the second pattern 3202 are electrically continuous through a metal layer, which is different from the fourth metal layer 55$d$. Similarly, the first wiring section 310 can be divided into a first pattern 3101 and a second pattern 3102. Similarly, in the first embodiment, the first wiring section 310 and/or the second wiring section 320 may be divided into a plurality of metal patterns within a metal layer at an identical level.

Figure 5A:
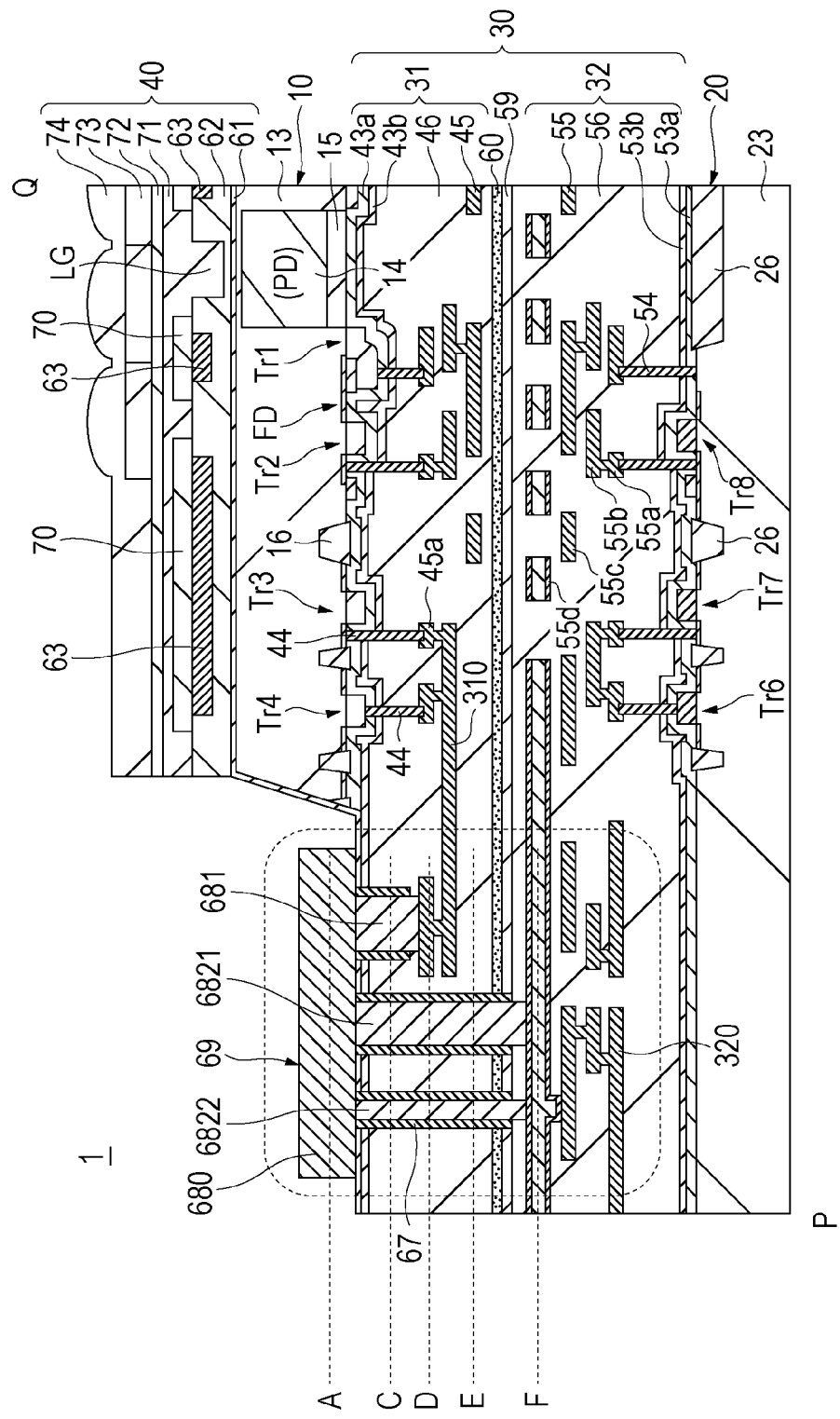

An example of a third embodiment will be now described with reference to FIGS. 5A and 5B. FIG. 5A is a cross-sectional view of a configuration as illustrated in FIG. 1B taken along the line P-Q of FIG. 1A. FIG. 5B is a diagram of plan views of part (including a connecting member 69) of FIG. 5A enclosed by a broken line at positions A, B, C, D, E, and F. Except for an arrangement of the connecting member 69 and a vicinity thereof, the present embodiment is similar to the first embodiment and, hence, the description thereof will not be repeated.

In the present embodiment, part of a first semiconductor substrate 10 is removed in advance, so that conductive sections of the connecting member 69 do not penetrate the first semiconductor substrate 10. Thus, FIG. 5B does not have a plane in which the conductive sections are surrounded by a semiconductor substrate as illustrated in the plane B of FIG. 2B and FIG. 4B. Two penetrating conductive sections, namely a first penetrating conductive section 6821 and a second penetrating conductive section 6822, are provided to penetrate a first semiconductor wafer. This improves the reliability of the connecting member 69. A non-penetrating conductive section 681 for a first wiring section 310 can be short in length because the first semiconductor substrate 10 does not have to be penetrated. One non-penetrating conductive section 681, therefore, may be provided as described in this example. Alternatively, a plurality of conductive sections in contact with the first wiring section 310 may be provided. Furthermore, the number of penetrating conductive sections in contact with a second wiring section 320 may be larger than the number of conductive sections in contact with the first wiring section 310 when the plurality of conductive sections in contact with the first wiring section 310 is provided. Here, in a manner dependent on a configuration of a circuit including semiconductor elements connected to the first wiring section 310, the number of conductive sections in contact with the first wiring section 310 may be larger than the number of conductive sections in contact with the second wiring section 320. This may be suitable for a case in which, for example, signals from the first wiring section 310 of the first semiconductor substrate 10 are distributed to a plurality of circuits of the second semiconductor substrate 20.

In addition, in the present embodiment, a coupling conductive section 680 of the connecting member 69 is used as an electrode pad, enabling the elimination of the opening 77 for the electrode pad 78. Similarly, the connecting member 69 may be used as the electrode pad in other embodiments. When the connecting member 69 is used as the electrode pad, the coupling conductive section 680 of the connecting member 69 may be made of aluminum, and a non-penetrating conductive section in contact with the first wiring section 310 and a penetrating conductive section in contact with the second wiring section 320 may be made of tungsten. This is because the aluminum, which has excellent corrosion resistance, is suitable as a material for the electrode pad.

Furthermore, in the present embodiment, the first penetrating conductive section 6821 and the second penetrating conductive section 6822 have different diameters. In this example, the first penetrating conductive section 6821 has a larger diameter than the second penetrating conductive section 6822. Different diameters provided for the penetrating conductive sections can ensure the reliability of the connection in accordance with the size of a possible foreign substance. This is because the probability of the existence of a foreign substance increases in proportion to the diameter of a conductive section. In other words, a large diameter for a conductive section does not always results in an improvement of the reliability of the connection, and, in some cases, a small diameter for the conductive section results in an improvement of the reliability of the connection.

With reference to FIGS. 6A to 6D, exemplified variations in positional relationship among a coupling conductive section 680, a plurality of penetrating conductive sections (a first penetrating conductive section 6821 and a second penetrating conductive section 6822), a plurality of non-penetrating conductive sections (a first non-penetrating conductive section 6811 and a second non-penetrating conductive section 6812), a first wiring section 310 and a second wiring section 320 will now be described. With reference to FIGS. 6A to 6D, the plurality of penetrating conductive sections and the plurality of non-penetrating conductive sections are both described, but the description may be applied to one of the plurality of penetrating conductive sections and the plurality of non-penetrating conductive sections. In FIGS. 6A to 6D, the layouts on planes A to F, which are illustrated separately in FIG. 2B, are superimposed.

For the reliability of the connection by a connecting member 69, accuracy at a phase in which a connection hole is provided and the accuracy at a phase in which a conductive section is provided are important. In addition, the accuracy at a phase in which a first semiconductor wafer 111 and a second semiconductor wafer 222 are aligned (alignment accuracy) for bonding is also important.

Figure 6A:
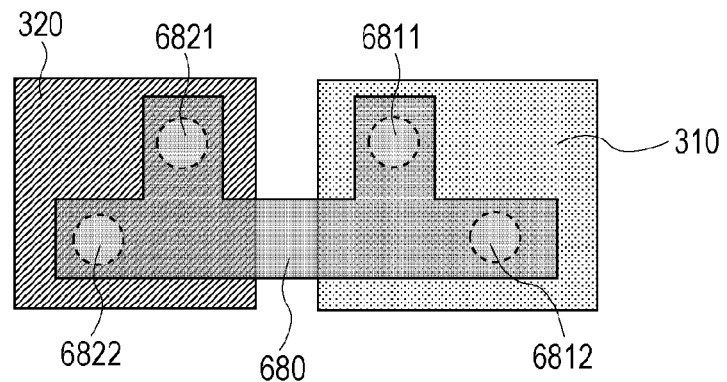
FIGS. 6A to 6D are schematic views of exemplary semiconductor devices.

As illustrated in a first example in FIG. 6A, a first non-penetrating conductive section 6811 and/or a second non-penetrating conductive section 6812 may be provided outside a straight line connecting a first penetrating conductive section 6821 and a second penetrating conductive section 6822. Furthermore, the straight line connecting the first penetrating conductive section 6821 and the second penetrating conductive section 6822 preferably intersects with a straight line connecting the first non-penetrating conductive section 6811 and the second non-penetrating conductive section 6812. In this manner, the connection is more likely to be provided even with some misalignment.

Figure 6B:
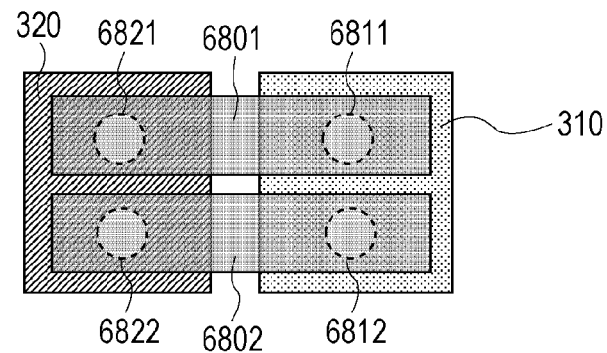

As illustrated in a second example in FIG. 6B, the coupling conductive section 680 may be divided into a plurality of metal patterns within a metal layer at an identical level. In FIG. 6B, a first coupling conductive section 6801 and a second coupling conductive section 6802 are provided. The first coupling conductive section 6801 couples a first non-penetrating conductive section 6811 and a first penetrating conductive section 6821. The second coupling conductive section 6802 couples a second non-penetrating conductive section 6812 and a second penetrating conductive section 6822. The first coupling conductive section 6801 and the second coupling conductive section 6802 are formed of separate metal patterns within a metal layer at an identical level.

Figure 6C:
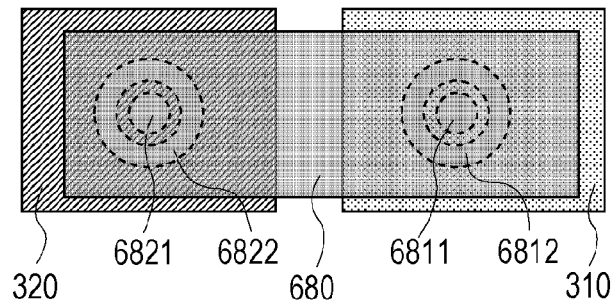

As illustrated in a third example in FIG. 6C, a first penetrating conductive section 6821 and a second penetrating conductive section 6822 may have nonsimilar shapes on a plane. In this example, the first penetrating conductive section 6821 has a shape of a solid cylinder, and the second penetrating conductive section 6822 has that of a hollow cylinder. The second penetrating conductive section 6822 encloses the first penetrating conductive section 6821. Similarly, a first non-penetrating conductive section 6811 has a shape of a solid cylinder, and a second non-penetrating conductive section 6812 has that of a hollow cylinder. The second non-penetrating conductive section 6812 encloses the first non-penetrating conductive section 6811.

Figure 6D:
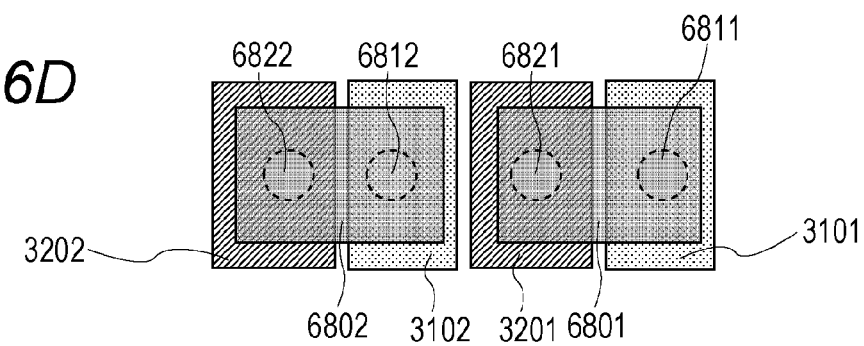

As illustrated in a fourth example in FIG. 6D, the second wiring section 320 may be divided into a first pattern 3201 and a second pattern 3202 within a metal layer at an identical level. The first pattern 3201 and the second pattern 3202 are metal patterns of the same fourth metal layer 55d of the second wiring section 320. The first pattern 3201 and the second pattern 3202 are electrically continuous through a metal layer that is not shown. Similarly, the first wiring section 310 may also be divided into a first pattern 3101 and a second pattern 3102. By dividing wiring into a plurality of patterns in this way, the reliability of the connection is further improved. Furthermore, in this example, the coupling conductive section is divided into a plurality of sections, namely a first coupling conductive section 6801 and a second coupling conductive section 6802, similarly to the second example. A first penetrating conductive section 6821 is connected to the first pattern 3201 of the second wiring section 320. A first non-penetrating conductive section 6811 is connected to the first pattern 3101 of the first wiring section 310. The first coupling conductive section 6801 couples the first penetrating conductive section 6821 and the first non-penetrating conductive section 6811. A second penetrating conductive section 6822 is connected to the second pattern 3202 of the second wiring section 320. A second non-penetrating conductive section 6812 is connected to the second pattern 3102 of the first wiring section 310. The second coupling conductive section 6802 couples the second penetrating conductive section 6822 and the second non-penetrating conductive section 6812.

Figure 7A:
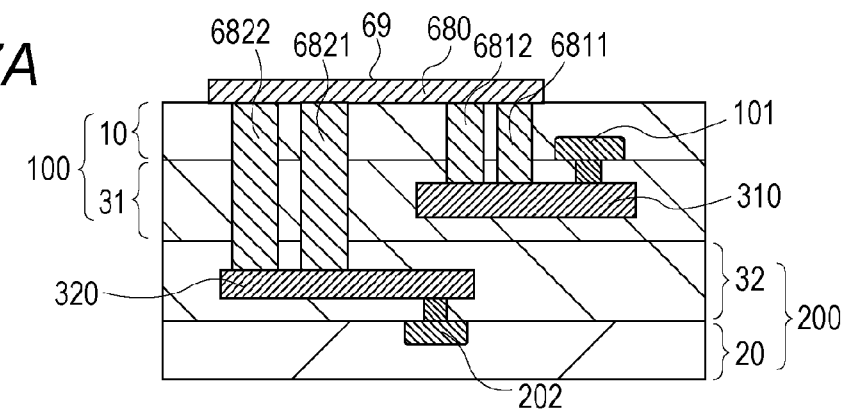
FIGS. 7A to 7D are schematic views of exemplary semiconductor devices.

Thus far, some embodiments have been described with the first semiconductor substrate 10, the first wiring structure 31, the second wiring structure 32, and the second semiconductor substrate 20 positioned in the sequence set forth, as illustrated in FIG. 7A, but this is not limiting. With reference to FIGS. 7A to 7D, a laminate, including a first member 100 and a second member 200 bonded together, is each illustrated with a connecting member 69 formed therein, with the first member 100 and the second member 200 in a different orientation. The first member 1001 includes a first semiconductor element 101 and a first wiring structure 31 that includes a first wiring section 310 connected to the first semiconductor element 101. The second member 200 includes a second semiconductor element 202 and a second wiring structure 32 that includes a second wiring section 320 connected to the second semiconductor element 202. The connecting member 69 is provided to include the first wiring section 310 and the second wiring section 320. The connecting member 69 includes a plurality of penetrating conductive sections (a first penetrating conductive section 6821 and a second penetrating conductive section 6822). The penetrating conductive sections each penetrate the first member 100 and are electrically continuous with the second wiring section 320. In addition, the connecting member 69 may include conductive sections (a first non-penetrating conductive section 6811 and a second non-penetrating conductive section 6812), which are each electrically continuous with the first wiring section 310. Furthermore, the connecting member 69 may include a coupling conductive section 680 that couples the penetrating conductive sections and the conductive sections. FIGS. 7A and 7D have abovementioned commonalties. As described above, the penetrating conductive sections may be formed in a phase to form, at corresponding positions, a plurality of penetrating connection holes that penetrates the first member 100 to reach the second wiring section 320 and in a phase to form a conductive section, which is in contact with the second wiring section 320, inside each of the penetrating connection holes. The conductive sections for the first wiring section 310 are formed in a similar manner.

Figure 7B:
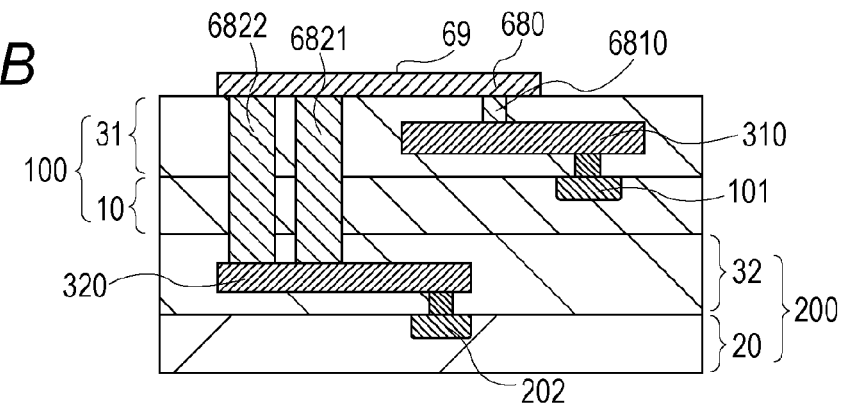

FIG. 7B is a diagram of an embodiment in which a first wiring structure 31, a first semiconductor substrate 10, a second wiring structure 32, and a second semiconductor substrate 20 are positioned in the sequence set forth. A plurality of penetrating conductive sections, namely 6821 and 6822, penetrates a first semiconductor wafer 111 (to be specific, the first semiconductor substrate 10 and the first wiring structure 31) to be connected to a second wiring section 320. A non-penetrating conductive section 6810 is formed relatively shallowly to be connected to a first wiring section 310. Thus, the number of the non-penetrating conductive section 6810 is one in this embodiment, but the number thereof may be more than one.

Figure 7C:
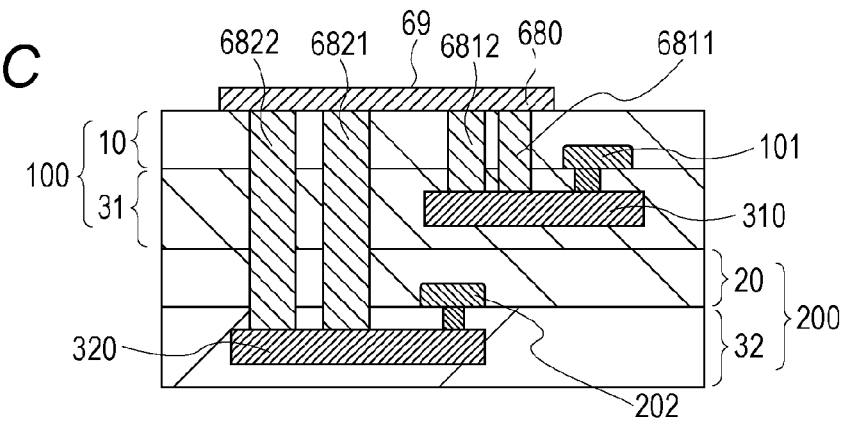
Figure 7D:
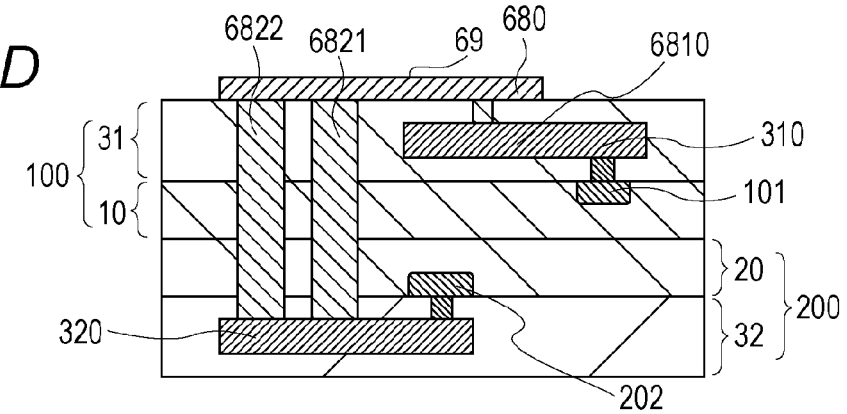

FIG. 7C is a diagram of an embodiment in which a first semiconductor substrate 10, a first wiring structure 31, a second semiconductor substrate 20, and a second wiring structure 32 are positioned in the sequence set forth. A plurality of penetrating conductive sections, namely 6821 and 6822, penetrates a first semiconductor wafer 111 (to be specific, the first semiconductor substrate 10 and the first wiring structure 31) and the second semiconductor substrate 20 to be connected to a second wiring section 320. A plurality of non-penetrating conductive sections, namely 6811 and 6812 and connected to a first wiring section 310, penetrates the first semiconductor substrate 10. The number of conductive sections connected to the first wiring section 310 may be one.

FIG. 7D is a diagram of an embodiment in which a first wiring structure 31, a first semiconductor substrate 10, a second semiconductor substrate 20, and a second wiring structure 32 are positioned in the sequence set forth. A plurality of penetrating conductive sections, namely 6821 and 6822, penetrates a first semiconductor wafer 111 (to be specific, the first semiconductor substrate 10 and the first wiring structure 31) and the second semiconductor substrate 20.

As described above, a plurality of conductive sections is provided to be in contact with the second wiring section 320, resulting in improved reliability of the electrical continuity between the first wiring section 310 and the second wiring section 320, which allows an improved yield of a semiconductor device. Furthermore, a plurality of conductive sections is provided to be in contact with the first wiring section 310, resulting in improved reliability of the electrical continuity between the first wiring section 310 and the second wiring section 320, which allows an improved yield of a semiconductor device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-124838, filed May 31, 2012, which is hereby incorporated by reference herein in its entirety.

What is claimed is:

1. A manufacturing method for a semiconductor device, the method comprising:
preparing a laminate of a first component and a second component, the first component comprising a first semiconductor substrate and a first conductive line supported by the first semiconductor substrate, the second component comprising a second semiconductor substrate and a second conductive line supported by the second semiconductor substrate; and
forming a connecting member configured to electrically connect the first conductive line and the second conductive line of the laminate,
wherein the forming of the connecting member comprises:
a phase of perforating the laminate from a side of the first component to form a plurality of connection holes that reach the first conductive line; and
a phase of filling the plurality of connection holes with a conductive material to form conductive sections in contact with the first conductive line.

2. The manufacturing method for a semiconductor device according to claim 1,
wherein the forming of the connecting member further comprises:
a phase of perforating the laminate to form a connection hole that reaches the second conductive line; and
a phase of filling the connection hole that reaches the second conductive line with a conductive material to form a conductive section in contact with second conductive line,
the phase of forming the connection holes that reach the first conductive line and the phase of forming the connection hole that reaches the second conductive line are performed separately, and
the phase of filling the connection holes that reach the first conductive line with the conductive material and the phase of filling the connection hole that reaches the second conductive line with the conductive material are performed in parallel.

3. A manufacturing method for a semiconductor device, the method comprising:
preparing a laminate of a first component and a second component, the first component comprising a first semiconductor substrate and a first conductive line supported by the first semiconductor substrate, the second component comprising a second semiconductor substrate and a second conductive line supported by the second semiconductor substrate; and
forming a connecting member configured to electrically connect the first conductive line and the second conductive line of the laminate,
wherein the forming of the connecting member comprises:
a phase of perforating the laminate from a side of the first component to form a plurality of connection holes that reach the second conductive line; and
a phase of filling the plurality of connection holes with a conductive material to form conductive sections in contact with the second conductive line.

4. The manufacturing method for a semiconductor device according to claim 3, wherein the forming of the connecting member further comprises:
a phase of perforating the laminate from the side of the first component to form a plurality of connection holes that reach the first conductive line; and
a phase of filling the plurality of connection holes with a conductive material to form conductive sections in contact with the first conductive line.

5. The manufacturing method for a semiconductor device according to claim 3, wherein the connection holes have different diameters from one another.

6. The manufacturing method for a semiconductor device according to claim 3, wherein the connection holes that reach the second conductive line are formed such that the first conductive line is exposed.

7. The manufacturing method for a semiconductor device according to claim 3, wherein the second conductive line is formed into a plurality of separate metal patterns within a metal layer at an identical level, and each of the connection holes is formed for each of the metal patterns.

8. The manufacturing method for a semiconductor device according to claim 3, wherein the forming of the connecting member is performed with a dual damascene process.

9. The manufacturing method for a semiconductor device according to claim 3, further comprising dividing the laminate into a plurality of chips after the forming of the connecting member.

10. The manufacturing method for a semiconductor device according to claim 3, further comprising forming at least one of a color filter and a micro lens at a side of the first semiconductor substrate opposite to the second semiconductor substrate after the forming of the connecting member, the first semiconductor substrate comprising a photoelectric conversion element.

11. The manufacturing method for a semiconductor device according to claim 3,
wherein the forming of the connecting member further comprises:
a phase of perforating the laminate to form a connection hole that reaches the first conductive line; and
a phase of filling the connection hole that reaches the first conductive line with a conductive material to form a conductive section in contact with first conductive line,
the phase of forming the connection holes that reach the second conductive line and the phase of forming the connection hole that reaches the first conductive line are performed separately, and
the phase of filling the connection holes that reach the second conductive line with the conductive material and the phase of filling the connection hole that reaches the first conductive line with the conductive material are performed in parallel.

12. The manufacturing method for a semiconductor device according to claim 3, wherein the first component further comprises a plurality of metal layers each formed of copper as a primary material, and the connecting member is in contact with one of the metal layers of the first component, the one of the metal layers being closest to the first semiconductor substrate.

13. The manufacturing method for a semiconductor device according to claim 3, wherein the forming of the connecting member further comprises:
a phase of perforating the laminate to form a connection hole that reaches the first conductive line; and
a phase of filling the connection hole that reaches the first conductive line with a conductive material to form a conductive section in contact with the first conductive line.

14. The manufacturing method for a semiconductor device according to claim 13, wherein the phase of filling the connection hole that reaches the first conductive line with the conductive material and the phase of filling the connection holes that reach the second conductive line with the conductive material are performed in parallel.

15. The manufacturing method for a semiconductor device according to claim 13, wherein the phase of forming the connection hole that reaches the first conductive line and the phase of forming the connection holes that reach the second conductive line are performed separately.

16. The manufacturing method for a semiconductor device according to claim 13, wherein the connection holes that reach the second conductive line and the connection hole that reaches the first conductive line differ in at least one of a diameter and the number of holes.

17. The manufacturing method for a semiconductor device according to claim 13, wherein the forming of the connecting member further comprises a phase of forming a coupling conductive section into a plurality of separate metal patterns within a metal layer at an identical level, the coupling conductive section being configured to couple the conductive sections in contact with the second conductive line and the conductive section in contact with the first conductive line.

* * * * *